US011444094B2

(12) United States Patent
Park et al.

(10) Patent No.: US 11,444,094 B2
(45) Date of Patent: Sep. 13, 2022

(54) THREE-DIMENSIONAL SEMICONDUCTOR MEMORY DEVICE

(71) Applicant: Samsung Electronics Co., Ltd., Suwon-si (KR)

(72) Inventors: Sejun Park, Yongin-si (KR); Jaeduk Lee, Seongnam-si (KR); Jaehoon Jang, Seongnam-si (KR); Jin-Kyu Kang, Seoul (KR); Seungwan Hong, Seongnam-si (KR); Okcheon Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 16/782,737

(22) Filed: Feb. 5, 2020

(65) Prior Publication Data
US 2020/0303390 A1    Sep. 24, 2020

(30) Foreign Application Priority Data

Mar. 22, 2019 (KR) .................. 10-2019-0033056

(51) Int. Cl.
*H01L 27/11582* (2017.01)
*H01L 27/11556* (2017.01)
*G11C 5/02* (2006.01)

(52) U.S. Cl.
CPC ........ *H01L 27/11556* (2013.01); *G11C 5/025* (2013.01); *H01L 27/11582* (2013.01)

(58) Field of Classification Search
CPC ................. H01L 27/11578; H01L 27/11582
See application file for complete search history.

(56) References Cited

U.S. PATENT DOCUMENTS

| | | |
|---|---|---|
| 7,969,789 B2 | 6/2011 | Katsumata et al. |
| 8,658,499 B2 | 2/2014 | Makala et al. |
| 8,735,962 B2 | 5/2014 | Whang et al. |
| 8,748,966 B2 | 6/2014 | Whang et al. |
| 8,952,443 B2 | 2/2015 | Chang et al. |
| 9,257,573 B2 | 2/2016 | Choi et al. |
| 9,263,596 B2 | 2/2016 | Yoo |
| 9,281,414 B2 | 3/2016 | Won et al. |
| 9,728,546 B2 | 8/2017 | Serov et al. |
| 9,960,180 B1 | 5/2018 | Zhou et al. |
| 9,991,277 B1 | 6/2018 | Tsutsumi et al. |
| 10,032,935 B2 | 7/2018 | Higuchi et al. |

(Continued)

*Primary Examiner* — Christopher A Johnson
(74) *Attorney, Agent, or Firm* — Myers Bigel, P.A.

(57) ABSTRACT

A semiconductor memory device includes a stack structure including electrodes and insulating layers alternately stacked on a substrate, and a vertical channel structure penetrating the stack structure. The vertical channel structure includes a semiconductor pattern and a vertical insulating layer between the semiconductor pattern and the electrodes. The vertical insulating layer includes a charge storage layer, a filling insulating layer, and a tunnel insulating layer. The vertical insulating layer has a cell region between the semiconductor pattern and each electrode and a cell separation region between the semiconductor pattern and each insulating layer. A portion of the charge storage layer of the cell region is in physical contact with the tunnel insulating layer. The filling insulating layer is between the semiconductor pattern and a remaining portion of the charge storage layer of the cell region.

20 Claims, 27 Drawing Sheets

(56) References Cited

U.S. PATENT DOCUMENTS

| | | |
|---|---|---|
| 2017/0018563 A1 | 1/2017 | Nishida |
| 2018/0033799 A1* | 2/2018 | Kanamori ......... H01L 27/11565 |
| 2018/0269215 A1* | 9/2018 | Chiang ............. H01L 27/11582 |

* cited by examiner

THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2019-0033056 filed on Mar. 22, 2019 in the Korean Intellectual Property Office, the entire contents of which are hereby incorporated by reference.

BACKGROUND

Inventive concepts relate to a semiconductor device, and, more particularly, to three-dimensional semiconductor memory devices with improved reliability.

Semiconductor devices have been highly integrated for providing high performance and lower prices, which are desired by customers. Because integration of semiconductor devices is a factor in determining product price, demand for highly integrated semiconductor devices may increase. Integration of typical two-dimensional or planar semiconductor devices is primarily determined by the area occupied by a unit memory cell, such that it is influenced by the level of technology for forming fine patterns. However, the processing equipment used to increase pattern fineness may set a practical limitation on increasing the integration of the two-dimensional or planar semiconductor devices due to the cost thereof. Therefore, there have been proposed three-dimensional semiconductor memory devices having three-dimensionally arranged memory cells.

SUMMARY

Some example embodiments of the inventive concepts provide a three-dimensional semiconductor memory device with improved reliability.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a vertical insulating layer between the semiconductor pattern and the plurality of electrodes. The vertical insulating layer may comprise a charge storage layer, a filling insulating layer, and a tunnel insulating layer. The vertical insulating layer may have a cell region between the semiconductor pattern and each of the plurality of electrodes and a cell separation region between the semiconductor pattern and each of the plurality of insulating layers. The charge storage layer may comprise a first portion and a remaining portion in the cell region, The first portion of the charge storage layer of the cell region may be in physical contact with the tunnel insulating layer. The filling insulating layer may be between the semiconductor pattern and the remaining portion of the charge storage layer of the cell region.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a vertical insulating layer between the semiconductor pattern and the plurality of electrodes. The vertical insulating layer may comprise a charge storage layer, a filling insulating layer, and a tunnel insulating layer. The filling insulating layer and the tunnel insulating layer may be between the charge storage layer and the semiconductor pattern. The vertical insulating layer may have a cell region between the semiconductor pattern and each of the plurality of electrodes and a cell separation region between the semiconductor pattern and each of the plurality of insulating layers. The filling insulating layer of the cell region may have a first thickness in a first direction parallel to the substrate. The filling insulating layer of the cell separation region may have a second thickness in the first direction. The second thickness may be greater than the first thickness.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a vertical insulating layer between the semiconductor pattern and the plurality of electrodes. The vertical insulating layer may include a charge storage layer, a filling insulating layer, and a tunnel insulating layer. The vertical insulating layer may have a cell region between the semiconductor pattern and each of the plurality of electrodes and a cell separation region between the semiconductor pattern and each of the plurality of insulating layers. A bottom surface of the cell separation region may be at a level substantially the same as a level of a bottom surface of the insulating layer adjacent to the cell separation region. A top surface of the cell separation region may be at a level substantially the same as a level of a top surface of the insulating layer adjacent to the cell separation region. The filling insulating layer may extend from the bottom surface of the cell separation region toward the top surface of the cell separation region.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a charge storage layer between the semiconductor pattern and the plurality of electrodes. Each of the plurality of electrodes may comprise a body part and a protrusion part that protrudes from the body part toward the semiconductor pattern. A boundary between the body part and the protrusion part may be aligned with an outer sidewall of the charge storage layer. The outer sidewall may face the plurality of insulating layers. The body part may have a first thickness. The protrusion part may have a second thickness that decreases with decreasing distance from the semiconductor pattern. A maximum value of the second thickness of the protrusion part may be the same as or less than the first thickness.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a vertical insulating layer between the semiconductor pattern and the plurality of electrodes. The vertical insulating layer may comprise a charge storage layer and a tunnel insulating layer between the charge storage layer and the semiconductor pattern. The vertical insulating layer may have a data storage part between the semiconductor pattern and each of the plurality of electrodes and a connection part between a pair of the data storage parts adjacent to each other in a direction normal to the substrate. The connection part may include a filling insulating layer between the tunnel insulating layer and the charge storage layer. The filling insulating layer may be in physical contact with the tunnel insulating layer. The filling insulating layer may separate the tunnel insulating layer of the connection part from the charge storage layer of the connection part.

According to some example embodiments of the present inventive concepts, a semiconductor memory device may comprise: a stack structure comprising a plurality of electrodes and a plurality of insulating layers that are alternately stacked on a substrate; and a vertical channel structure penetrating the stack structure. The vertical channel structure may comprise a semiconductor pattern and a vertical insulating layer between the semiconductor pattern and the plurality of electrodes. The vertical insulating layer may include a charge storage layer. The vertical insulating layer may have a data storage part between the semiconductor pattern and each of the plurality of electrodes and a connection part between a pair of the data storage parts adjacent to each other in a direction normal to the substrate. The connection part may include an air gap and a filling insulating layer that are between the semiconductor pattern and each of the plurality of insulating layers.

According to some example embodiments of the present inventive concepts, a semiconductor memory device comprises a stack structure comprises a plurality of electrodes and a plurality of insulating layers that are alternately stacked on a substrate and a vertical channel structure penetrating the stack structure. The vertical channel structure comprises a semiconductor pattern and a vertical insulating layer between the semiconductor pattern and the plurality of electrodes. The vertical insulating layer comprises a charge storage layer and a tunnel insulating layer between the charge storage layer and the semiconductor pattern. The vertical insulating layer has a data storage part between the semiconductor pattern and each of the plurality of electrodes and a connection part between a pair of the data storage parts adjacent to each other in a direction normal to the substrate. A length of the charge storage layer of the connection part is greater than a distance between the pair of the data storage parts.

DETAILED DESCRIPTION OF EMBODIMENTS

The inventive concepts will now be described more fully with reference to the accompanying drawings, in which example embodiments of the inventive concept are shown. As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 1:
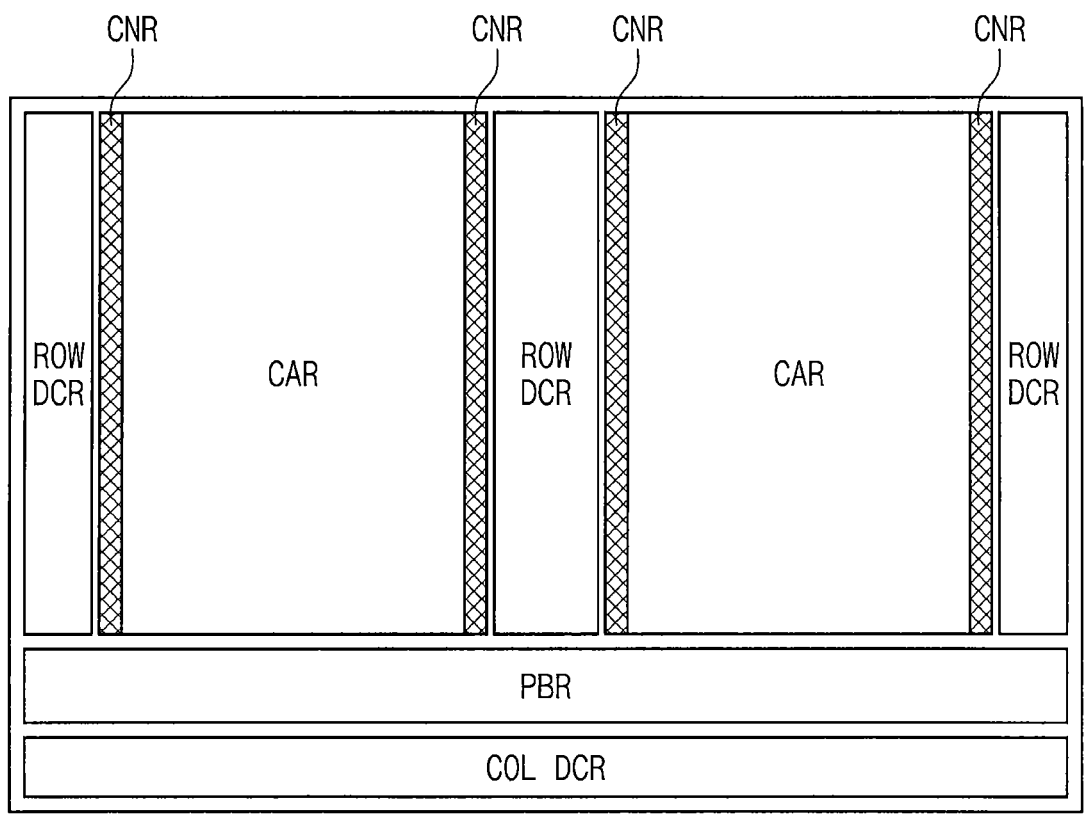
FIG. 1 illustrates a schematic diagram showing a simplified configuration of a three-dimensional semiconductor memory device according to some example embodiments of the inventive concepts.

FIG. 1 illustrates a schematic diagram showing a simplified configuration of a three-dimensional semiconductor memory device according to some example embodiments of the inventive concepts.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a connection region CTR may be disposed between the cell array region CAR and the row decoder regions ROW DCR.

The cell array region CAR may include a memory cell array including a plurality of memory cells. In some embodiments, the memory cell array may include three-dimensionally arranged memory cells and a plurality of word lines and bit lines electrically connected to the memory cells.

The row decoder region ROW DCR may include a row decoder that selects the word lines of the memory cell array, and the connection region CTR may include a wiring structure that electrically connects the memory cell array and the row decoder to each other. Based on address information, the row decoder may select one of the word lines of the memory cell array. The row decoder may provide word line voltages to the selected word line and unselected word lines in response to a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may act as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

Figure 2:
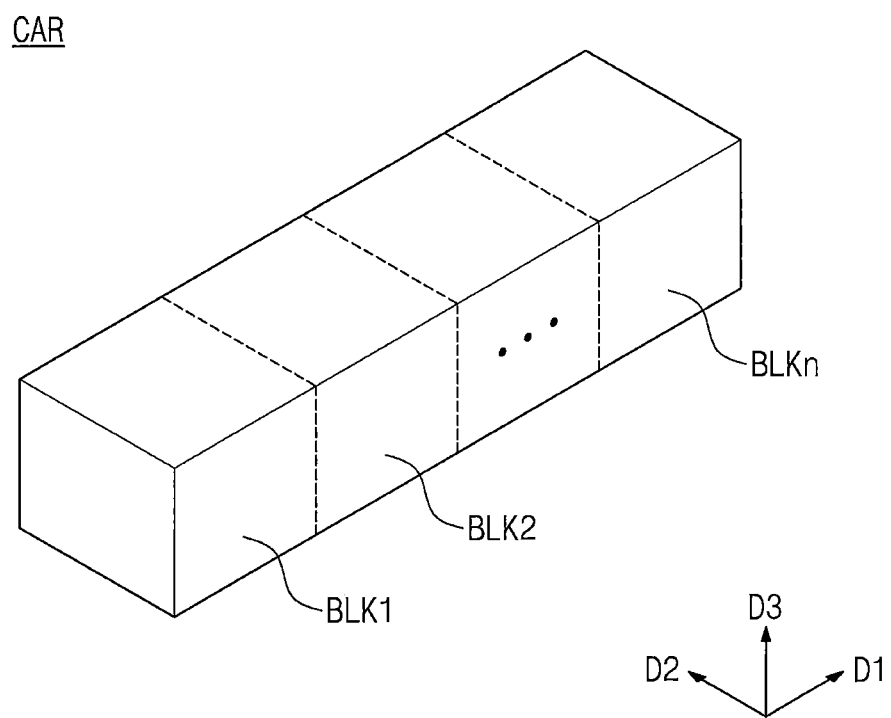
FIG. 2 illustrates a simplified block diagram showing a cell array of a three-dimensional semiconductor memory device according to some example embodiments of inventive concepts.

FIG. 2 illustrates a simplified block diagram showing a cell array of a three-dimensional semiconductor memory device according to some example embodiments of the inventive concepts.

Referring to FIG. 2, the cell array region CAR may include a plurality of cell array blocks BLK1, BLK2, . . . , and BLKn. Each of the cell array blocks BLK1, BLK2, . . . , and BLKn may include a stack structure having electrodes stacked along a third direction D3 on a plane elongated along first and second directions D1 and D2. The stack structure may combine with a plurality of vertical structures (or semiconductor pillars) to constitute three-dimensionally arranged memory cells. In addition, each of the cell array blocks BLK1, BLK2, . . . , and BLKn may include bit lines electrically connected to the memory cells.

Figure 3:
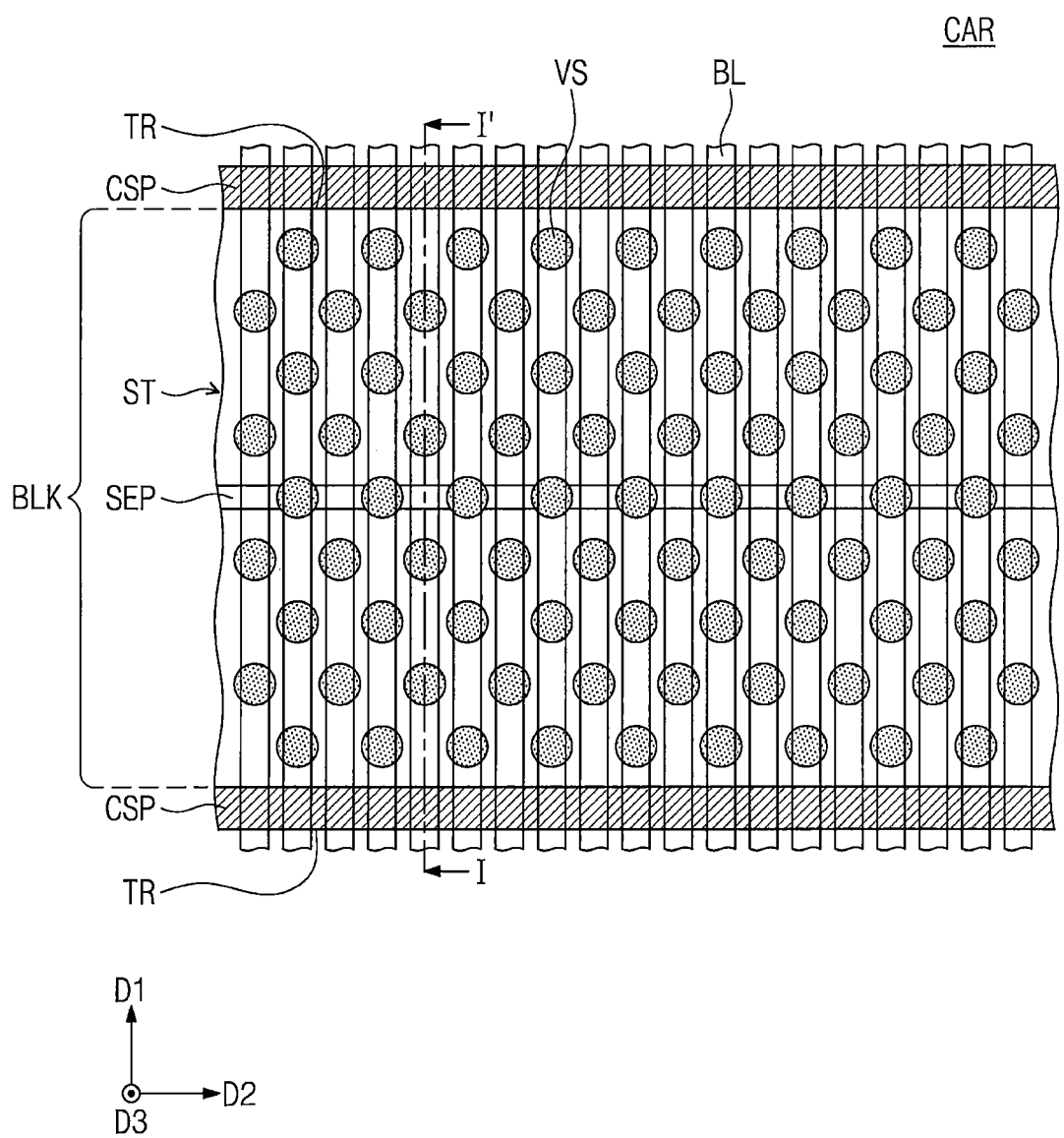
FIG. 3 illustrates a plan view showing a three-dimensional semiconductor memory device according to some example embodiments of the inventive concepts.
Figure 4:
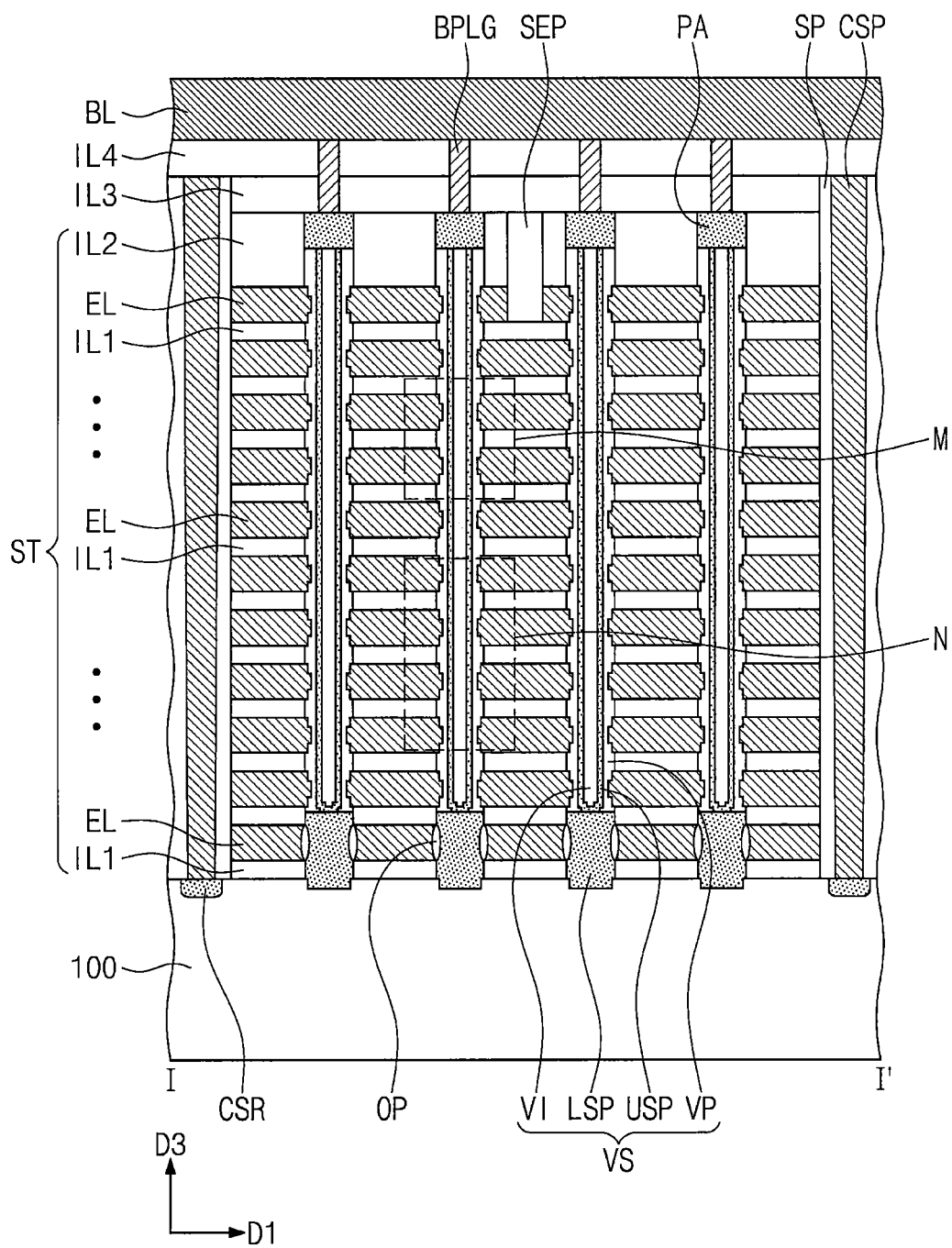
FIG. 4 illustrates a cross-sectional view taken along line I-I' of FIG. 3.
Figure 5A:
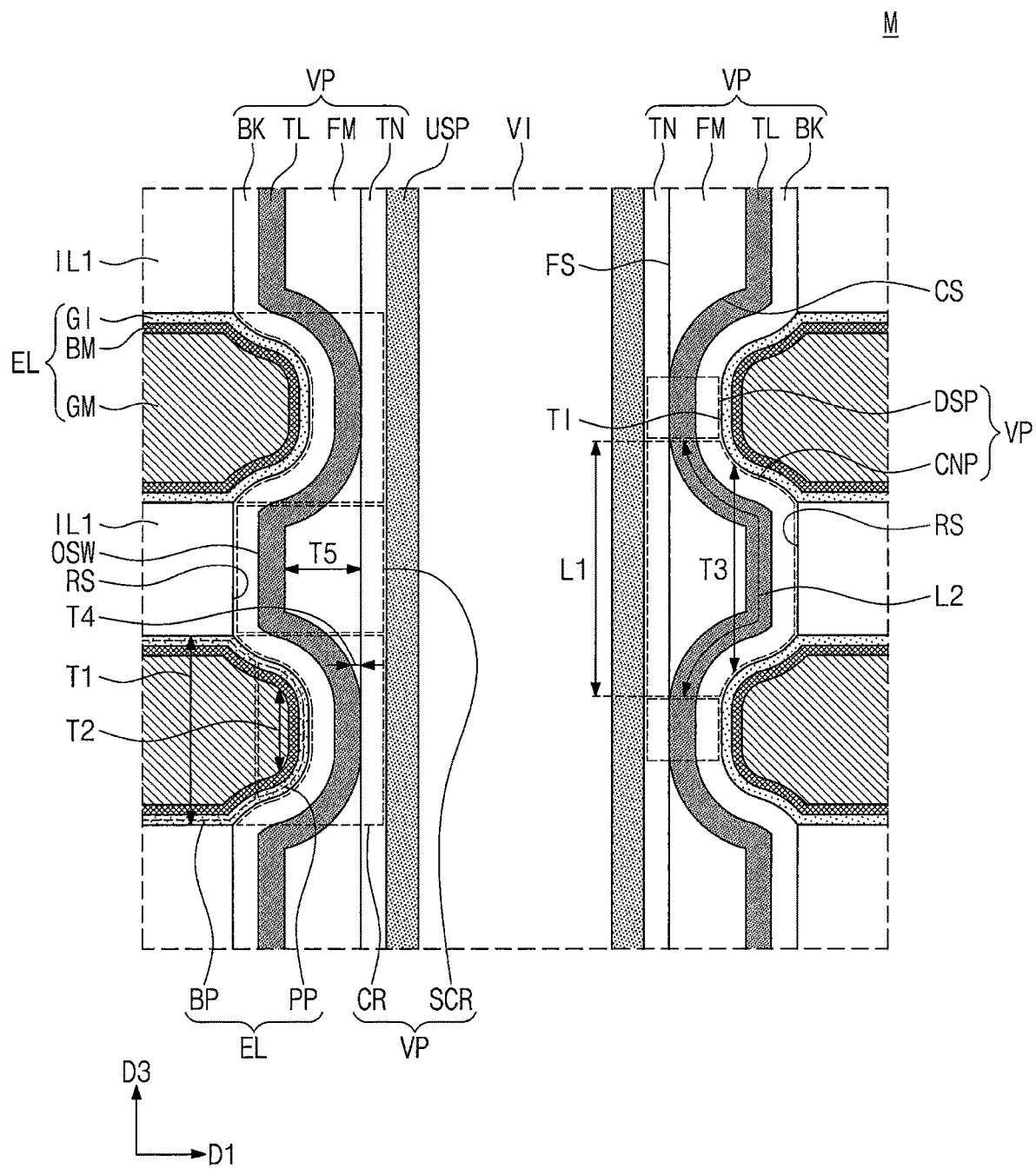
FIG. 5A illustrates an enlarged cross-sectional view showing section M of FIG. 4.
Figure 5B:
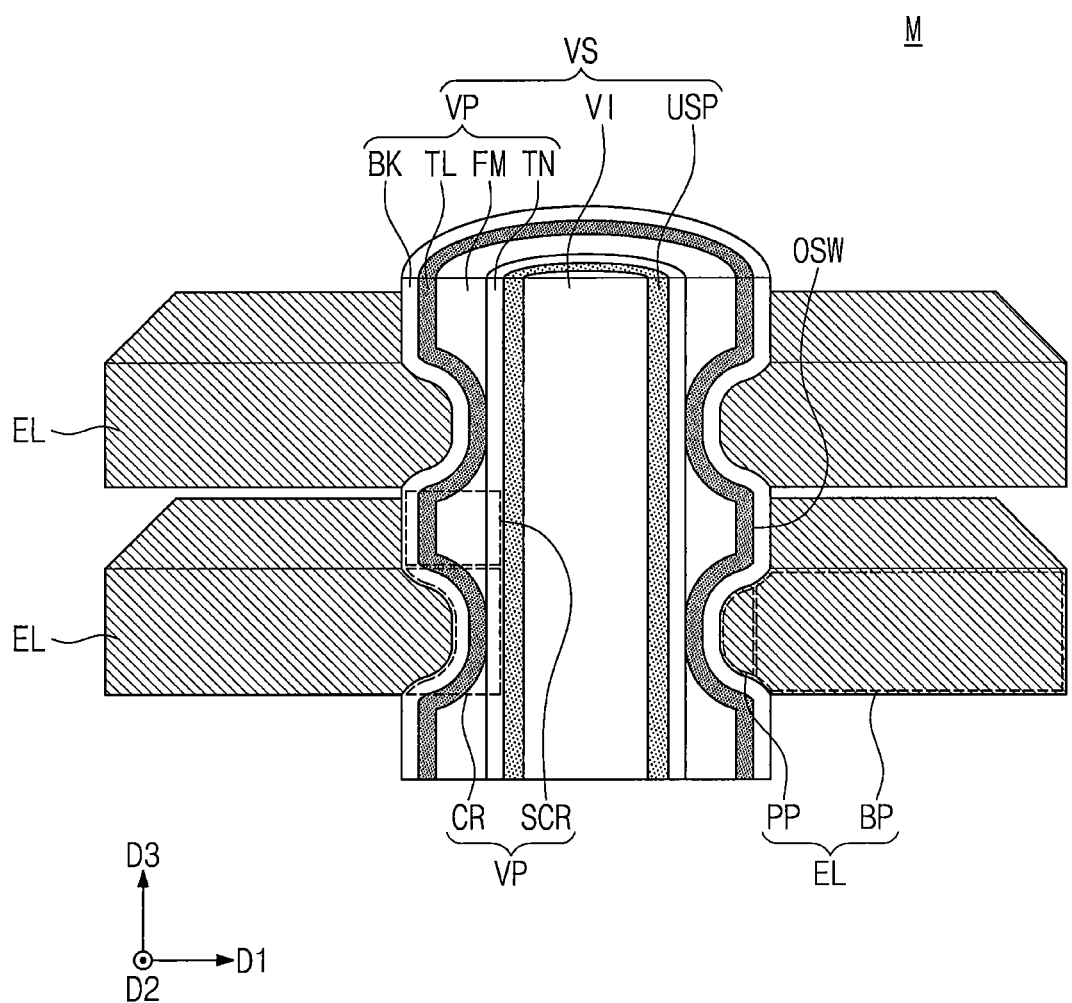
FIG. 5B illustrates a simplified perspective view showing section M of FIG. 4.

FIG. 3 illustrates a plan view showing a three-dimensional semiconductor memory device according to some example embodiments of the inventive concepts. FIG. 4 illustrates a cross-sectional view taken along line I-I' of FIG. 3. FIG. 5A illustrates an enlarged cross-sectional view showing section M of FIG. 4. FIG. 5B illustrates a simplified perspective view showing section M of FIG. 4.

Referring to FIGS. 3, 4, 5A, and 5B, a substrate 100 may include a cell array region CAR. For example, the substrate 100 may be a silicon substrate, a germanium substrate, or a silicon-germanium substrate. The substrate 100 may have a first conductivity type (e.g., p-type).

A cell array block BLK may be disposed on the substrate 100. The cell array block BLK may include a stack structure ST having first insulating layers IL1 and electrodes EL that are vertically and alternately stacked. The stack structure ST may extend along a second direction D2 on the cell array region CAR. FIG. 3 illustrates an example of a single stack structure ST, but the inventive concepts are not limited thereto. For example, the stack structure ST may be provided in plural. The plurality of stack structures ST may be arranged along a first direction D1 intersecting the second direction D2.

Common source regions CSR may be provided on opposite sides of the stack structure ST. The common source regions CSR may be formed on an upper portion of the substrate 100. The common source regions CSR may extend parallel to the stack structure ST along the second direction D2. The common source regions CSR may be doped with impurities to have a second conductivity type. For example, the common source regions CSR may be doped with n-type impurities, such as arsenic (As) or phosphorous (P).

A common source plug CSP may be coupled to the common source region CSR. The common source plug CSP may vertically overlap the common source region CSR. The common source plug CSP may extend parallel to the stack structure ST along the second direction D2. An insulating spacer SP may be interposed between the common source plug CSP and the stack structure ST.

The electrodes EL of the stack structure ST may be stacked along a third direction D3 perpendicular to a top surface of the substrate 100. The electrodes EL vertically overlapping each other may be vertically separated from each other across the first insulating layer IL1 disposed therebetween.

A lowermost electrode EL of the stack structure ST may be a lower selection line. An uppermost electrode EL of the stack structure ST may be an upper selection line. The electrodes EL other than the lower and upper selection lines may be word lines. A separation insulating pattern SEP may extend in the second direction D2, while running across the uppermost electrode EL (or the upper selection line). The separation insulating pattern SEP may include an insulating material (e.g., a silicon oxide layer).

The stack structure ST may further include a second insulating layer IL2 on the uppermost electrode EL (or the upper selection line). The second insulating layer IL2 may be thicker than the first insulating layer IL1. The second insulating layer IL2 may at least partially cover a top surface of the separation insulating pattern SEP.

The electrodes EL may include a conductive material selected from the group consisting of doped semiconductors (e.g., doped silicon), metals (e.g., tungsten, copper, or aluminum), conductive metal nitrides (e.g., titanium nitride or tantalum nitride), and transition metals (e.g., titanium or tantalum). The first insulating layers IL1 and the second insulating layer IL2 may include a silicon oxide layer.

The cell array region CAR may be provided thereon with a plurality of vertical channel structures VS penetrating the stack structure ST. The vertical channel structures VS may be provided in corresponding channel holes CH of the stack structure ST. For example, a first column may comprise four vertical channel structures VS arranged in the first direction D1, and a second column may comprise five vertical channel structures VS arranged in the first direction D1. The first column and the second column may be arrayed repeatedly and alternately along the second direction D2.

Each of the vertical channel structures VS may include a vertical insulating layer VP, an upper semiconductor pattern USP, a lower semiconductor pattern LSP, and a buried insulating pattern VI. The vertical insulating layer VP may extend along an inner wall of the channel hole CH toward the substrate 100. The upper semiconductor pattern USP may at least partially cover an inner wall of the vertical insulating layer VP and extend together with the vertical insulating layer VP toward the substrate 100.

The lower semiconductor pattern LSP may be provided in a lower portion of the channel hole CH and in physical contact with the substrate 100. The lower semiconductor pattern LSP may penetrate the lowermost electrode EL (or the lower selection line) of the stack structure ST. An oxidation pattern OP may be interposed between the lower semiconductor pattern LSP and the lowermost electrode EL (or the lower selection line).

The upper semiconductor pattern USP may have a pipe shape whose bottom is closed. The upper semiconductor pattern USP may have a bottom surface in direct physical contact with the lower semiconductor pattern LSP. The upper semiconductor pattern USP may have an inside at least partially filled with the buried insulating pattern VI. Each of the upper semiconductor pattern USP and the buried insulating pattern VI may have a diameter that gradually decreases with decreasing distance from the substrate 100. In some embodiments, the diameter may decrease monotonically with decreasing distance from the substrate 100. The lower and upper semiconductor patterns LSP and USP may be used as a channel of a three-dimensional semiconductor memory device according to some example embodiments of the inventive concepts.

For example, the lower and upper semiconductor patterns LSP and USP may include silicon (Si), germanium (Ge), or a combination thereof, and have different crystal structures from each other. The lower and upper semiconductor patterns LSP and USP may have one or more materials selected from a single crystalline structure, an amorphous structure, and a polycrystalline structure. The lower and upper semiconductor patterns LSP and USP may be either undoped or doped with impurities to have the first conductivity type, which is the same as that of the substrate 100.

In other embodiments, the lower semiconductor pattern LSP may be omitted. The upper semiconductor pattern USP may extend toward and directly physically contact the substrate 100. For example, a relationship between the vertical channel structure VS and the substrate 100 is not limited to that shown in FIG. 4, but may vary in accordance with different embodiments of the inventive concepts.

A conductive pad PA may be provided on an upper portion of each of the vertical channel structures VS. The conductive pad PA may at least partially cover a top surface of each of the vertical insulating layer VP, the upper semiconductor pattern USP, and the buried insulating pattern VI. The conductive pad PA may include an impurity-doped semiconductor material and/or a conductive material. The conductive pad PA may have a top surface generally coplanar with that of the second insulating layer IL2. The conductive pad PA may electrically connect the upper semiconductor pattern USP to a bit line contact plug BPLG, which will be described below.

The stack structure ST may be provided thereon with a third insulating layer IL3 and a fourth insulating layer IL4 that are sequentially stacked. The fourth insulating layer IL4 may be provided thereon with bit lines BL extending in the first direction D1. The bit line BL and the conductive pads PA may be provided therebetween with bit line contact plugs BPLG penetrating the fourth and third insulating layers IL4 and IL3. The bit line BL may be electrically connected through the bit line contact plug BPLG to the vertical channel structure VS.

Returning to FIGS. 5A and 5B, each of the electrodes EL may include an electrode pattern GM, a barrier pattern BM, and a dielectric pattern GI. The barrier pattern BM may be interposed between the electrode pattern GM and the dielectric pattern GI. The electrode pattern GM may include a conductive material selected from the group consisting of doped semiconductors, metals, and transition metals. The barrier pattern BM may include conductive metal nitride. The dielectric pattern GI may include one or more of a silicon oxide layer, a silicon nitride layer, a silicon oxynitride layer, and/or a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

The vertical insulating layer VP may include a blocking insulating layer BK, a charge storage layer TL, a filling insulating layer FM, and a tunnel insulating layer TN that are interposed between the electrode EL and the upper semiconductor pattern USP. For example, the blocking insulating layer BK may be provided on the electrode EL and the first insulating layer IL1. The blocking insulating layer BK may at least partially cover the electrode EL and the first insulating layer IL1. The charge storage layer TL may be provided on the blocking insulating layer BK. The tunnel insulating layer TN may be provided on the charge storage layer TL. The filling insulating layer FM may at least partially fill a space between the charge storage layer TL and the tunnel insulating layer TN. The tunnel insulating layer TN may at least partially cover an outer sidewall of the upper semiconductor pattern USP.

For example, the blocking insulating layer BK may include a silicon oxide layer. The charge storage layer TL may include a silicon nitride layer, a silicon oxynitride layer, and/or a silicon-rich nitride layer. The filling insulating layer FM may include a silicon oxide layer, a silicon nitride layer, and/or a silicon oxynitride layer. The tunnel insulating layer TN may include a material whose energy bandgap is greater than that of the charge storage layer TL. The tunnel insulating layer TN may include a silicon oxide layer and/or a high-k insulating layer, such as an aluminum oxide layer and/or a hafnium oxide layer.

The vertical insulating layer VP may include a cell region CR between the electrode EL and the upper semiconductor pattern USP and also include a cell separation region SCR between the first insulating layer IL1 and the upper semiconductor pattern USP.

The cell region CR may be located at the same vertical level relative to the substrate 100 as that of the electrode EL. For example, the cell region CR may have a bottom surface at substantially the same level as that of a bottom surface of the electrode EL, and also have a top surface at substantially the same level as that of a top surface of the electrode EL.

The cell separation region SCR may be located at the same vertical level as that of the first insulating layer IL1. For example, the cell separation region SCR may have a bottom surface at substantially the same level as that of a bottom surface of the first insulating layer IL1, and also have a top surface at substantially the same level as that of a top surface of the first insulating layer IL1.

The vertical insulating layer VP may include a plurality of cell regions CR between corresponding electrodes EL and the upper semiconductor pattern USP. The vertical insulating layer VP may include a plurality of cell separation regions SCR between corresponding first insulating layers IL1 and the upper semiconductor pattern USP. The cell separation region SCR may be interposed between a pair of cell regions CR vertically adjacent to each other. For example, the cell separation region SCR may connect the pair of cell regions CR to each other.

A portion of the charge storage layer TL of the cell region CR may directly physically contact the tunnel insulating layer TN. A remaining portion of the charge storage layer TL of the cell region CR may be spaced apart from the tunnel insulating layer TN across the filling insulating layer FM. For example, the filling insulating layer FM may be interposed between the upper semiconductor pattern USP and the remaining portion of the charge storage layer TL.

The filling insulating layer FM of the cell separation region SCR may be interposed between the charge storage layer TL and the upper semiconductor pattern USP. The filling insulating layer FM of the cell separation region SCR may be interposed between the charge storage layer TL and the tunnel insulating layer TN. The filling insulating layer FM of the cell separation region SCR may extend from the bottom surface of the cell separation region SCR to the top surface of the cell separation region SCR. The filling insulating layer FM of the cell separation region SCR may extend from the cell region CR above the cell separation region SCR to the cell region CR below the cell separation region SCR.

The filling insulating layer FM of the cell region CR may have a fourth thickness T4 horizontally as shown in FIG. 5A. For example, the filling insulating layer FM of the cell region CR may have a fourth thickness T4 in the first direction D1. The fourth thickness T4 of the filling insulating layer FM may increase with decreasing distance from the cell separation region SCR. In some embodiments, the fourth thickness T4 may increase monotonically with decreasing distance from the cell separation region SCR. The filling insulating layer FM of the cell separation region SCR may have a fifth thickness T5 horizontally as shown in FIG. 5A. The fifth thickness T5 may be greater than the fourth thickness T4.

The electrode EL may include a body part BP and a protrusion part PP. The charge storage layer TL of the cell separation region SCR may have an outer sidewall OSW facing the first insulating layer IL1. The body part BP of the electrode EL may be a distal end of the electrode EL, which distal end protrudes more toward the upper semiconductor pattern USP than the outer sidewall OSW of the charge storage layer TL. The outer sidewall OSW of the charge storage layer TL may define a boundary between the body part BP and the protrusion part PP. For example, the boundary between the body part BP and the protrusion part PP may be vertically aligned with the outer sidewall OSW of the charge storage layer TL.

The body part BP may have a top surface at least partially covered by the first insulating layer IL1 above the body part BP. The body part BP may have a bottom surface at least partially covered with the first insulating layer IL1 below the body part BP. The protrusion part PP may extend from the body part BP toward the upper semiconductor pattern USP.

The body part BP may have a first thickness T1. The first thickness T1 may be substantially the same as a distance between the first insulating layers IL1 vertically adjacent to each other. The protrusion part PP may have a second thickness T2. The second thickness T2 of the protrusion part PP may gradually decrease with decreasing distance from the upper semiconductor pattern USP. In some embodiments, the second thickness T2 may decrease monotonically with decreasing distance from the upper semiconductor pattern USP. The protrusion part PP may have a curved surface convexly directed toward the upper semiconductor pattern USP.

A maximum value of the second thickness T2 of the protrusion part PP may be the same as or less than that of the first thickness T1 of the body part BP. A maximum thickness of the electrode EL may be the same as the maximum value of the first thickness T1 of the body part BP. The electrode EL may have a thickness that gradually decreases at the protrusion part PP.

Between the first insulating layers IL1, the protrusion part PP protruding toward the upper semiconductor pattern USP may be thinner than the body part BP (T2<T1). The second thickness T2 of the protrusion part PP may gradually decrease with decreasing distance from the upper semiconductor pattern USP. In some embodiments, the thickness T2 may decrease monotonically with decreasing distance from the upper semiconductor pattern USP. As a result, it may be possible to obtain a relatively large space, or a recess region RS which will be discussed below, between the protrusion parts PP vertically adjacent to each other. The recess region RS may be stably or sufficiently filled with the blocking insulating layer BK and the charge storage layer TL.

The first insulating layer IL1 may be recessed in a direction away from the upper semiconductor pattern USP, and, therefore, the recess region RS may be defined. The recess region RS may be defined by the first insulating layer IL1 and a pair of vertically adjacent protrusion parts PP. Between the protrusion parts PP, the recess region RS may sink toward a direction away from the upper semiconductor pattern USP.

The vertical insulating layer VP may include a data storage part DSP on the protrusion part PP of the electrode EL and also include a connection part CNP on the first insulating layer IL1. The data storage part DSP may be a portion of the cell region CR described above. The connection part CNP may include the cell separation region SCR described above. The connection part CNP may at least partially fill the recess region RS. The connection part CNP may be interposed between a pair of data storage parts DSP vertically adjacent to each other. For example, the connection part CNP may connect the pair of data storage parts DSP to each other.

The data storage part DSP may be interposed between the protrusion part PP of the electrode EL and the upper semiconductor pattern USP. The data storage part DSP may be interposed between a tip end TI of the protrusion part PP and the upper semiconductor pattern USP. The data storage part DSP may include the blocking insulating layer BK, the charge storage layer TL, and the tunnel insulating layer TN. The data storage part DSP may not include the filling insulating layer FM. For example, the charge storage layer TL of the data storage part DSP may directly physically contact the tunnel insulating layer TN of the data storage part DSP.

A NAND Flash memory device may be embodied as a three-dimensional semiconductor memory device according to some example embodiments of inventive concepts. The data storage part DSP may be a region where data are stored in the NAND Flash memory device. Data stored in the data storage part DSP may be changed by Fouler-Nordheim tunneling induced by a difference in voltage between the electrode EL and the upper semiconductor pattern USP.

The connection part CNP may include the blocking insulating layer BK, the charge storage layer TL, the filling insulating layer FM, and the tunnel insulating layer TN. The tunnel insulating layer TN of the connection part CNP may be spaced apart from the charge storage layer TL across the filling insulating layer FM. The filling insulating layer FM may have a crooked or nonlinear surface CS conforming to a profile of the recess region RS. The filling insulating layer FM may have a flat surface FS conforming to a profile of the upper semiconductor pattern USP. The tunnel insulating layer TN may contact the flat surface FS of the filling insulating layer FM, and, thus, extend linearly. The charge storage layer TL may not contact the flat surface FS of the filling insulating layer FM. The charge storage layer TL may contact the crooked or nonlinear surface CS of the filling insulating layer FM. Therefore, differently from the tunnel insulating layer TN, the charge storage layer TL may be crooked or have a nonlinear shape due to the filling insulating layer FM. Because the charge storage layer TL is formed crookedly or with a nonlinear shape, as discussed below, the data storage part DSP may be less likely to suffer loss of data stored therein.

The connection part CNP may have a third thickness T3 vertically (e.g., in the third direction D3) relative to the substrate 100. The third thickness T3 of the connection part CNP may gradually increase with decreasing distance from the upper semiconductor pattern USP. In some embodiments, the third thickness may increase monotonically with decreasing distance from the upper semiconductor pattern USP. The connection part CNP may have a thickness profile opposite to that of the protrusion part PP discussed above.

The tunnel insulating layer TN of the connection part CNP may have a first length L1. The charge storage layer TL of the connection part CNP may have a second length L2. The second length L2 may be greater than the first length L1. The tunnel insulating layer TN of the connection part CNP may linearly extend from the data storage part DSP to an adjacent data storage part DSP, and, thus, the first length L1 may be relatively small. The charge storage layer TL of the connection part CNP may be crooked or have a nonlinear shape while at least partially filling the recess region RS, and, thus, the second length L2 may be relatively long. For example, the second length L2 may be about 1.5 to 5 times the first length L1 in some embodiments.

A semiconductor memory device according to some example embodiments of the inventive concepts may be configured such that the length L2 of the charge storage layer TL between neighboring data storage parts DSP may be greater than a distance (e.g., L1) between the neighboring data storage parts DSP. In this case, the data storage parts DSP may have therebetween a relatively long path through which charges are transferred.

Therefore, the semiconductor memory device according to some example embodiments of the inventive concepts may reduce or prevent data (charges) stored in the data storage part DSP from moving toward a different adjacent data storage part DSP. As a result, the semiconductor memory device according to some example embodiments of the inventive concepts may reduce or prevent loss of data stored in the data storage part DSP and also improve in reliability.

Figure 12A:
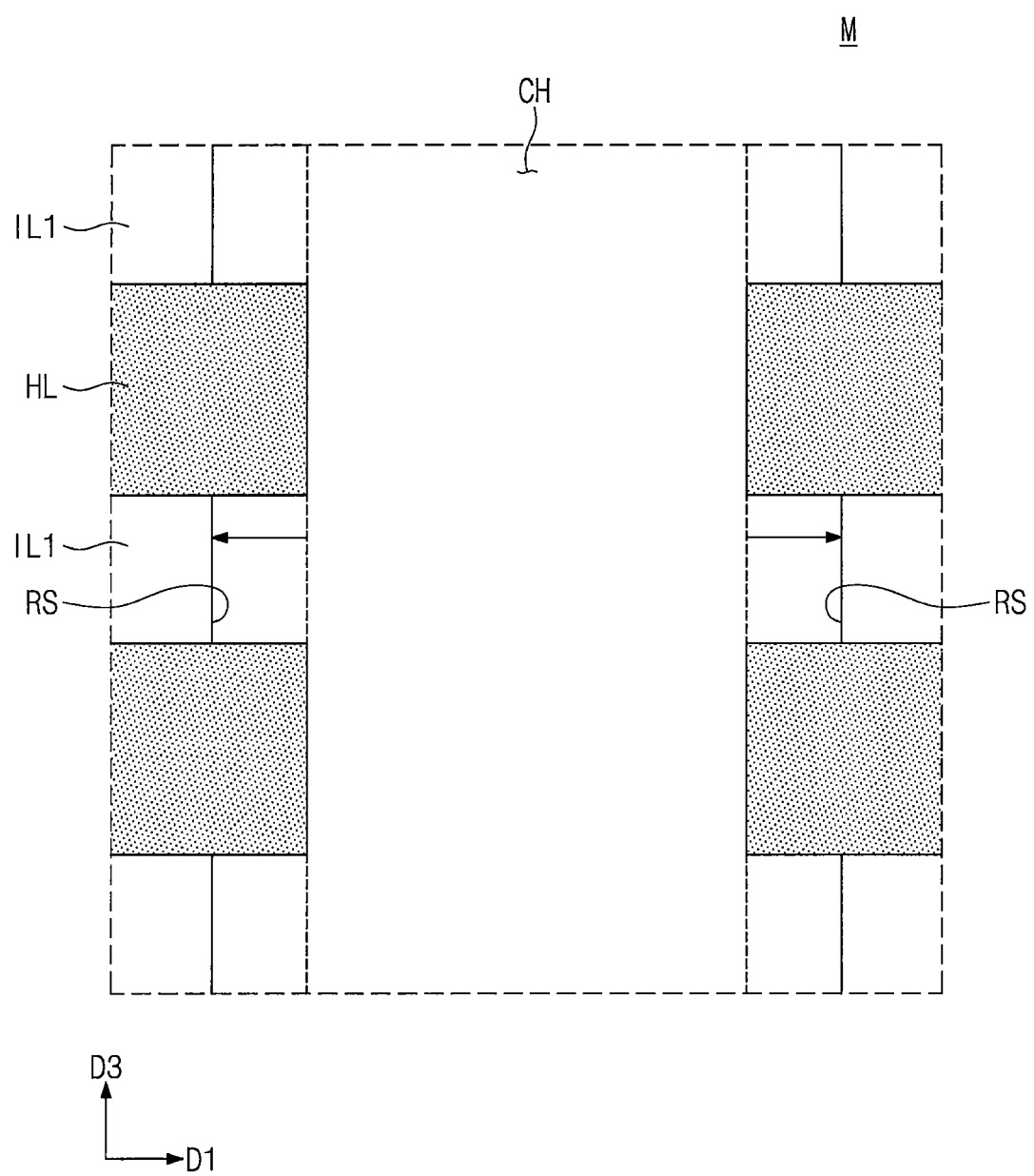
FIGS. 12A and 12B illustrate enlarged cross-sectional views showing section M of FIG. 8.
Figure 12B:
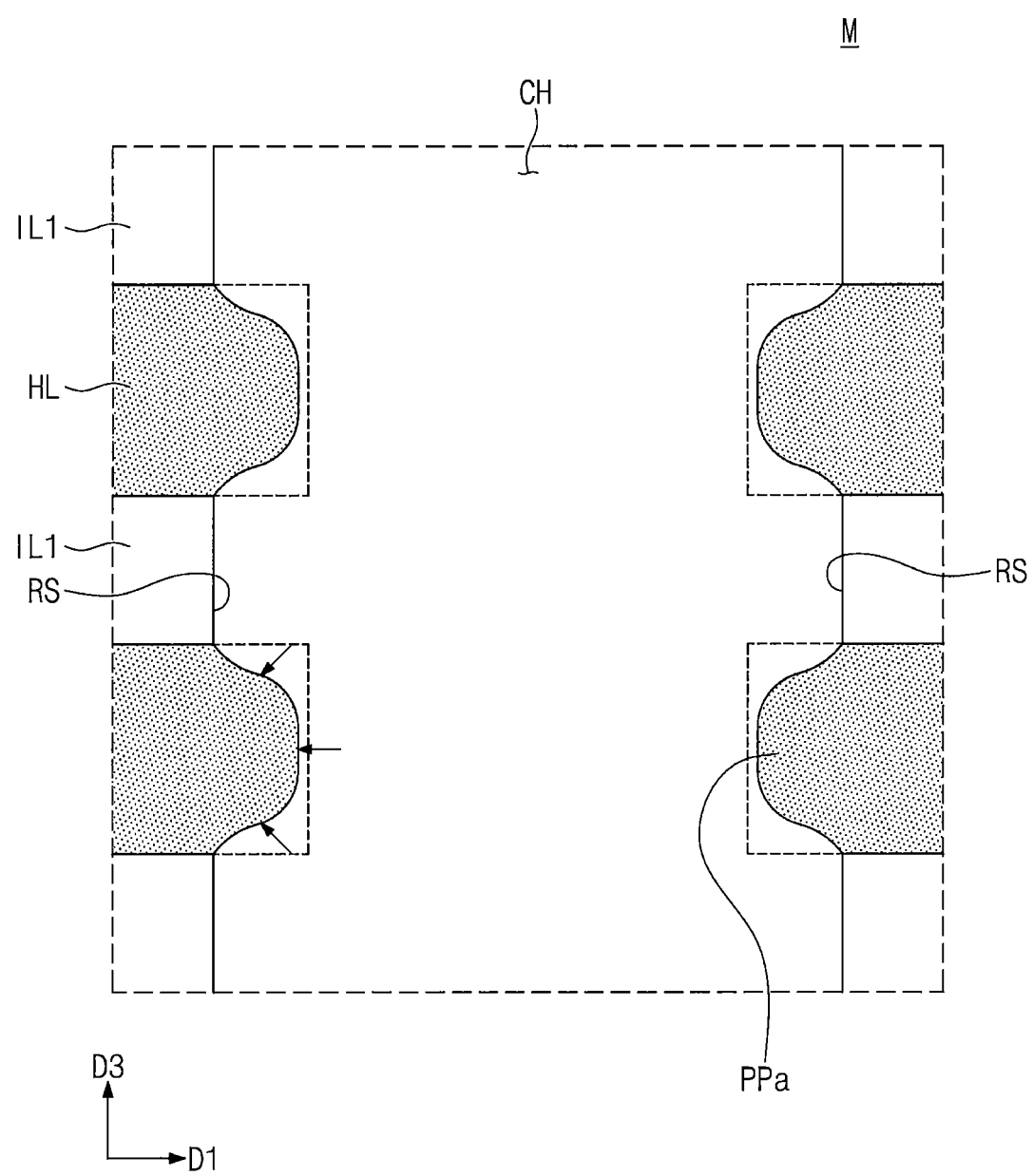
Figure 13A:
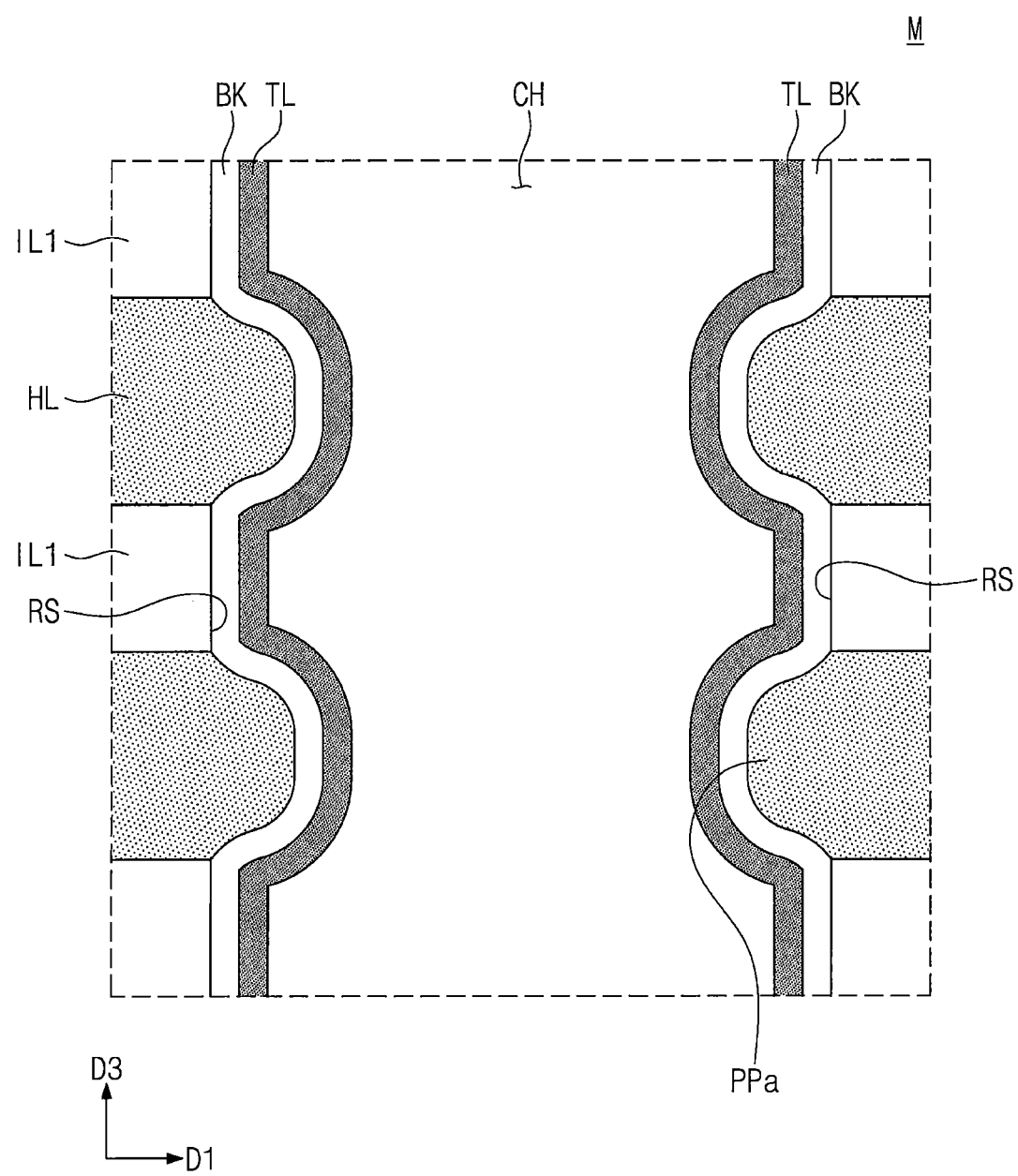
FIGS. 13A, 13B, and 13C illustrate enlarged cross-sectional views showing section M of FIG. 9.
Figure 13B:
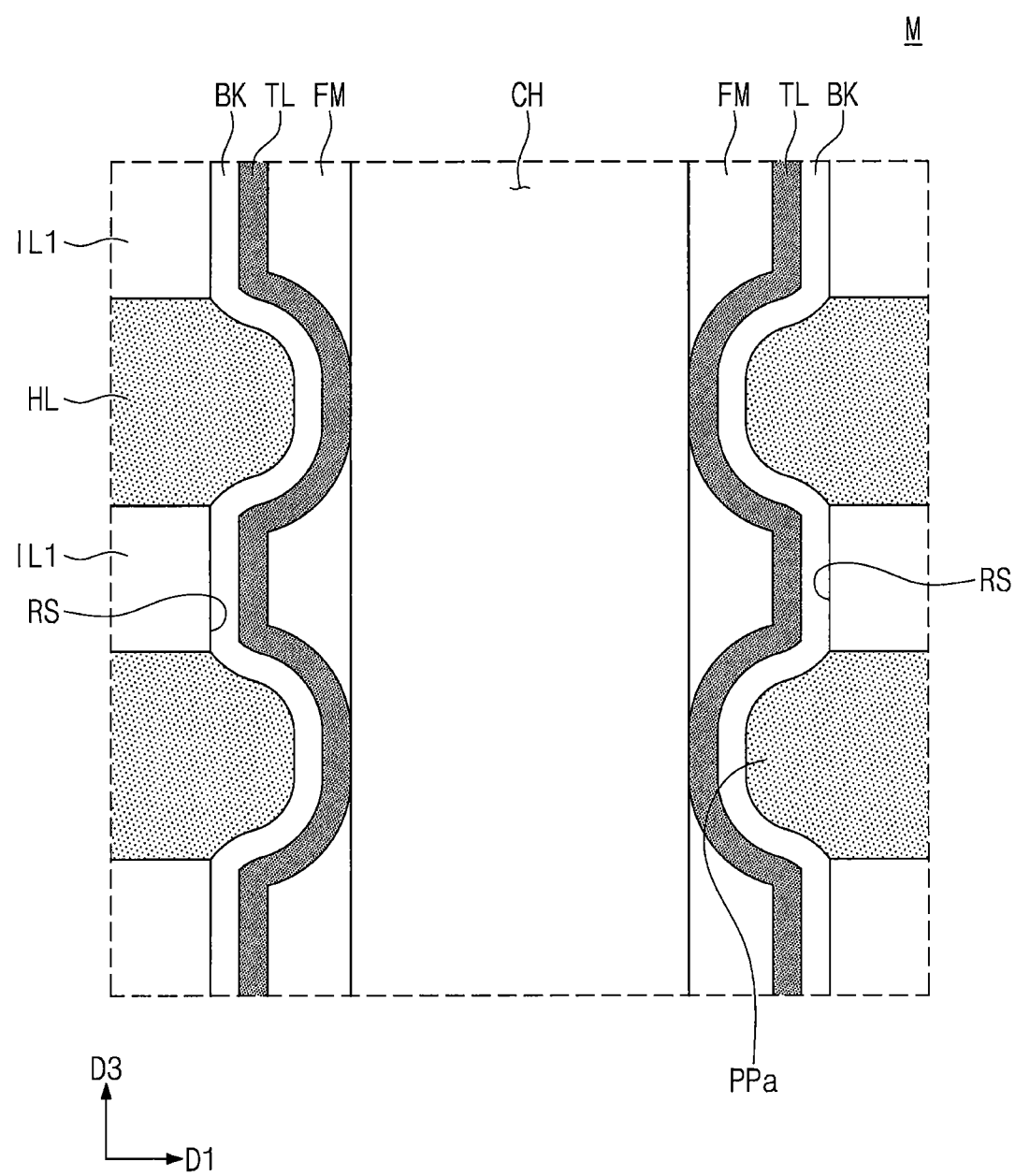
Figure 13C:
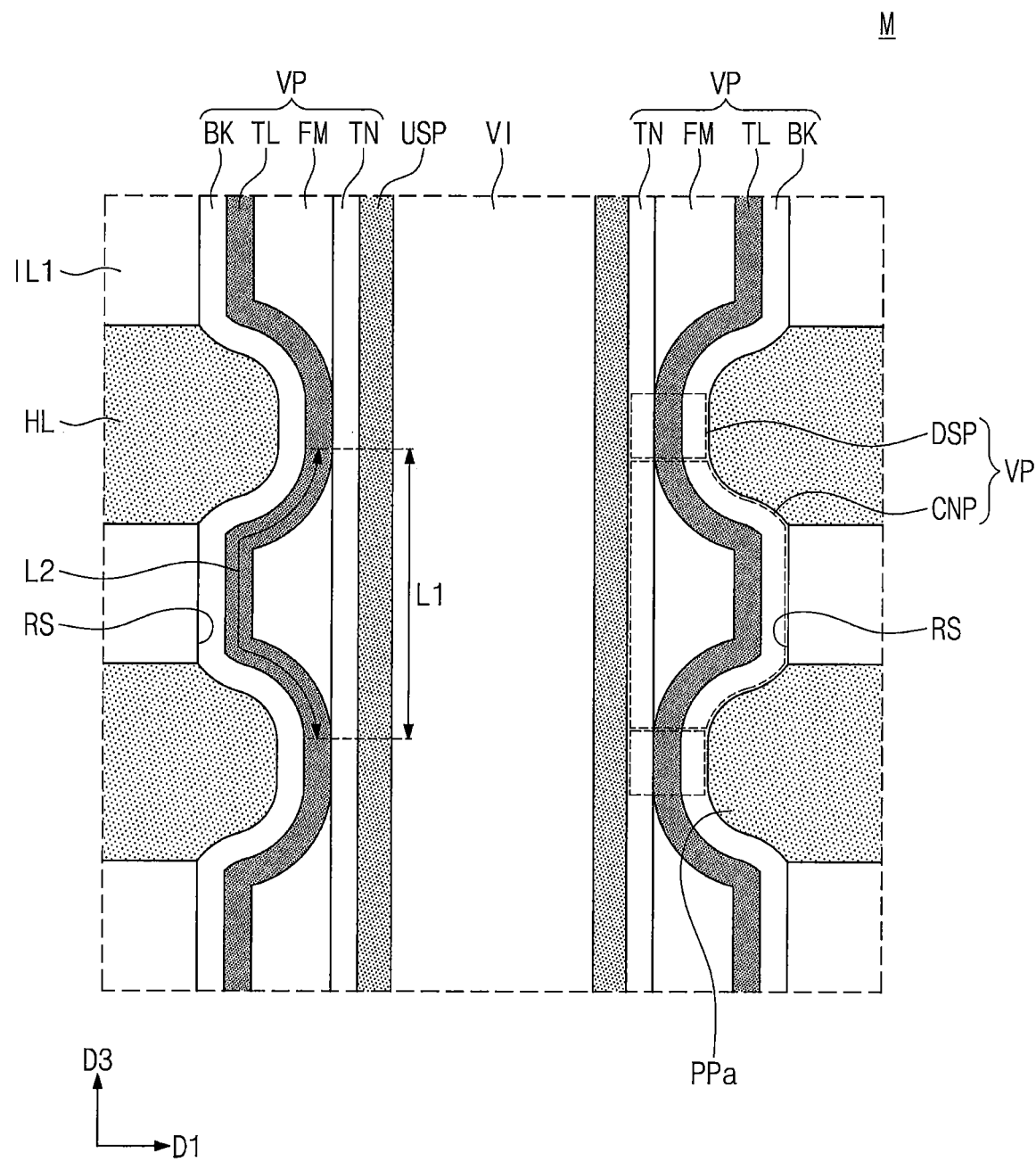
Figure 14:
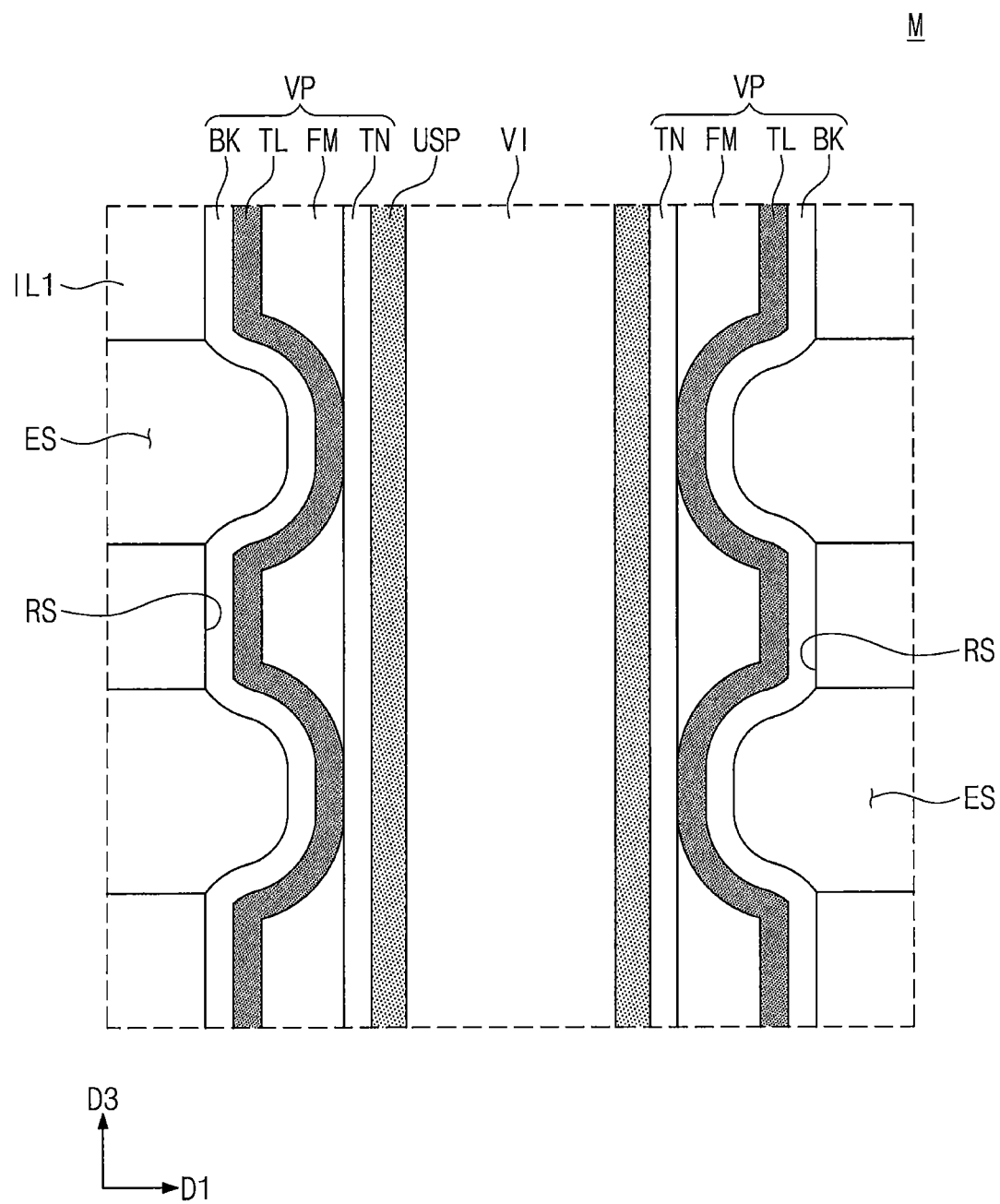
FIG. 14 illustrates an enlarged cross-sectional view showing section M of FIG. 11.

FIGS. 6 to 11 illustrate cross-sectional views taken along line I-I' of FIG. 3, showing a method of fabricating a three-dimensional semiconductor memory device according to some example embodiments of the inventive concepts. FIGS. 12A and 12B illustrate enlarged cross-sectional views showing section M of FIG. 8. FIGS. 13A, 13B, and 13C illustrate enlarged cross-sectional views showing section M of FIG. 9. FIG. 14 illustrates an enlarged cross-sectional view showing section M of FIG. 11.

Figure 6:
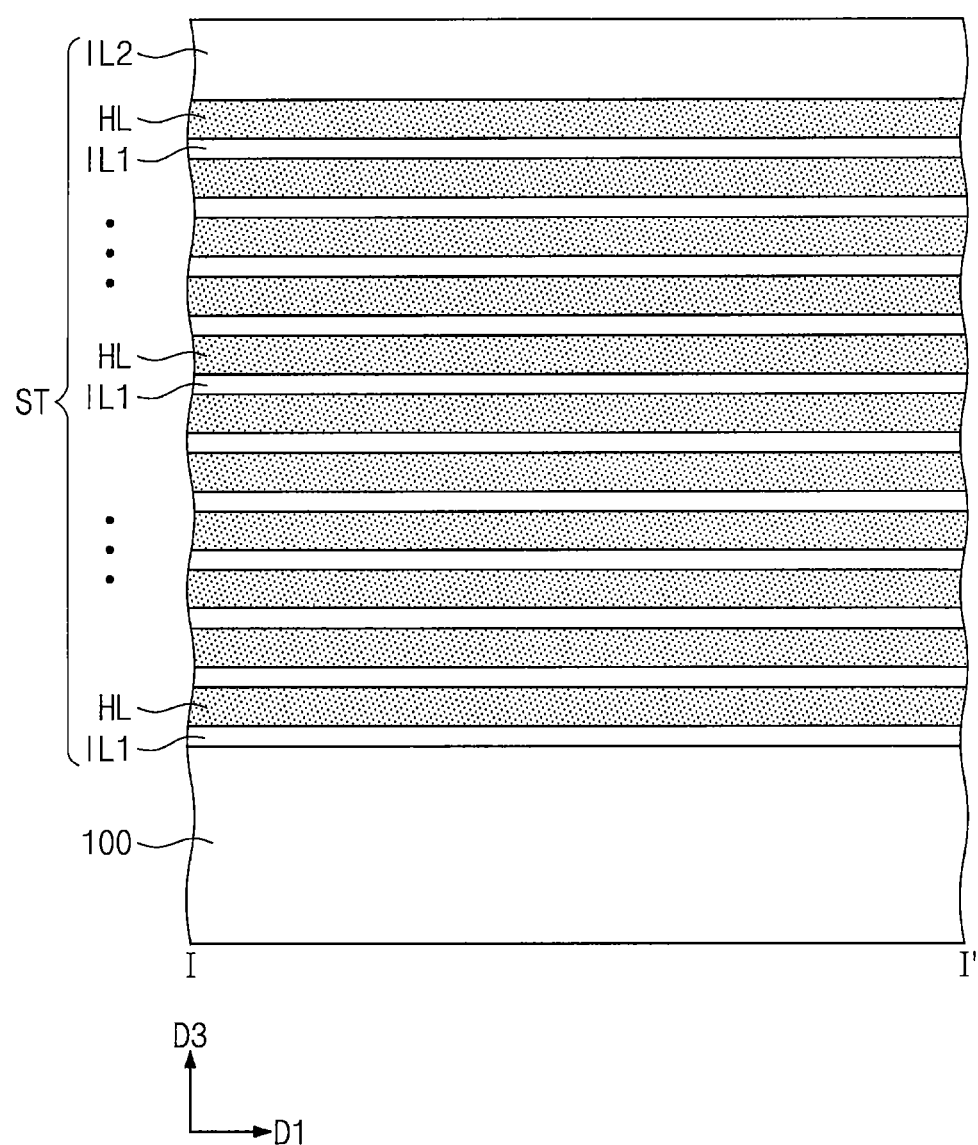
FIGS. 6 to 11 illustrate cross-sectional views taken along line I-I' of FIG. 3 showing a method of fabricating a three-dimensional semiconductor memory device according to some example embodiments of the inventive concepts.

Referring to FIGS. 3 and 6, first insulating layers IL1 and sacrificial layers HL may be vertically and alternately stacked on a portion of or an entire surface of a substrate 100 forming a stack structure ST. A second insulating layer IL2 may be formed on an uppermost sacrificial layer HL. For example, the substrate 100 may be a silicon substrate, a germanium substrate, and/or a silicon-germanium substrate.

The first insulating layers IL1, the second insulating layer IL2, and the sacrificial layers HL may be deposited by using thermal chemical vapor deposition (CVD), plasma enhanced CVD, physical CVD process, or atomic layer deposition (ALD). The first insulating layers IL1 and the second insulating layer IL2 may be formed of a silicon oxide layer, and the sacrificial layers HL may be formed of a silicon nitride layer and/or a silicon oxynitride layer.

Figure 7:
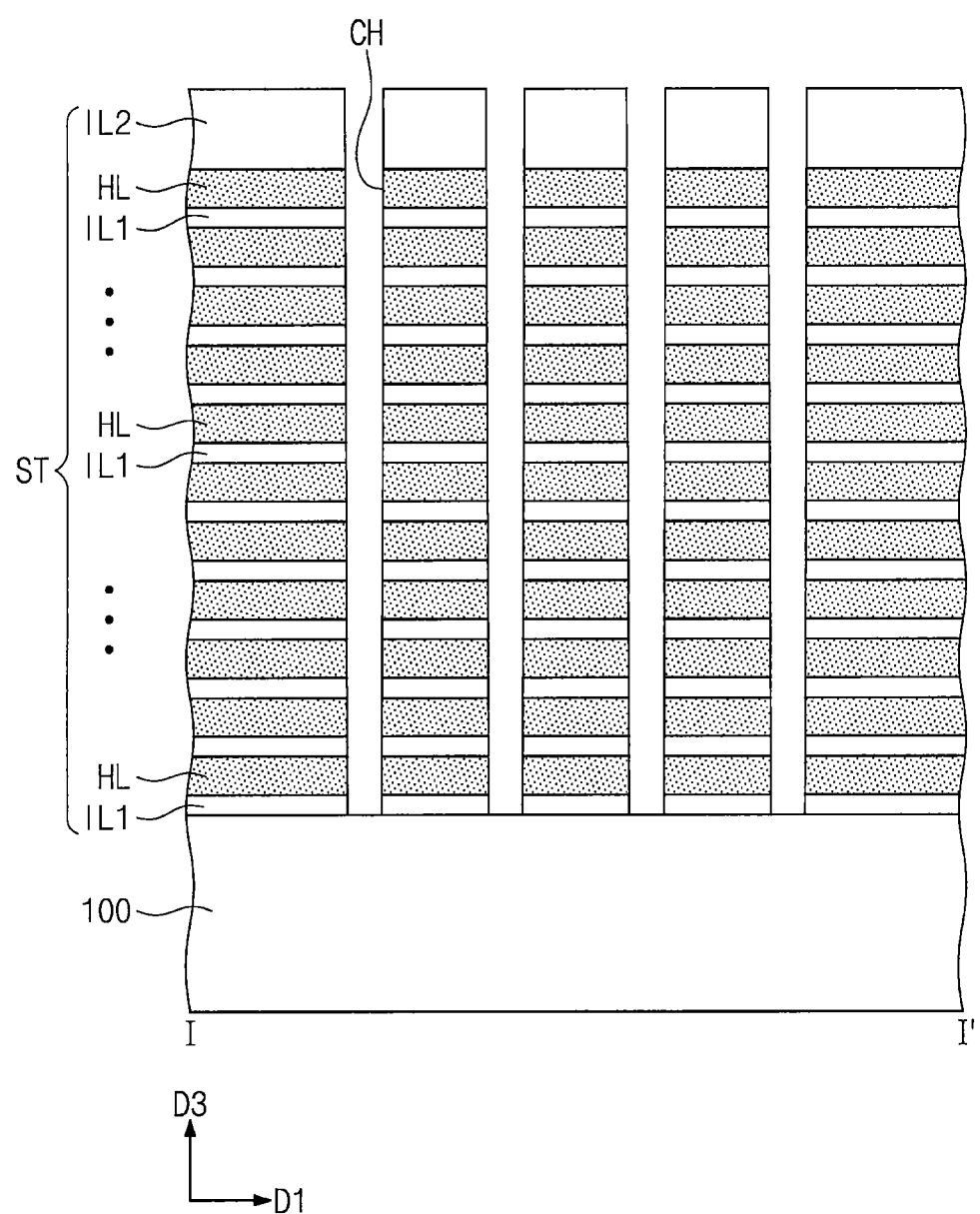

Referring to FIGS. 3 and 7, channel holes CH may be formed to penetrate the stack structure ST and to expose the substrate 100. The channel hole CH may have a diameter that gradually decreases with decreasing distance from the substrate 100. In some embodiments, the diameter of the channel hole CH may monotonically decrease with decreasing distance from the substrate 100.

For example, the formation of the channel holes CH may include forming on the stack structure ST a mask pattern having openings that define areas where the channel holes CH are formed, and performing an etching process in which the mask pattern is used as an etching mask to etch the stack structure ST. Afterwards, the mask pattern may be removed. The substrate 100 may be over-etched on its top surface during the etching process. Accordingly, an upper portion of the substrate 100 may be recessed.

Figure 8:
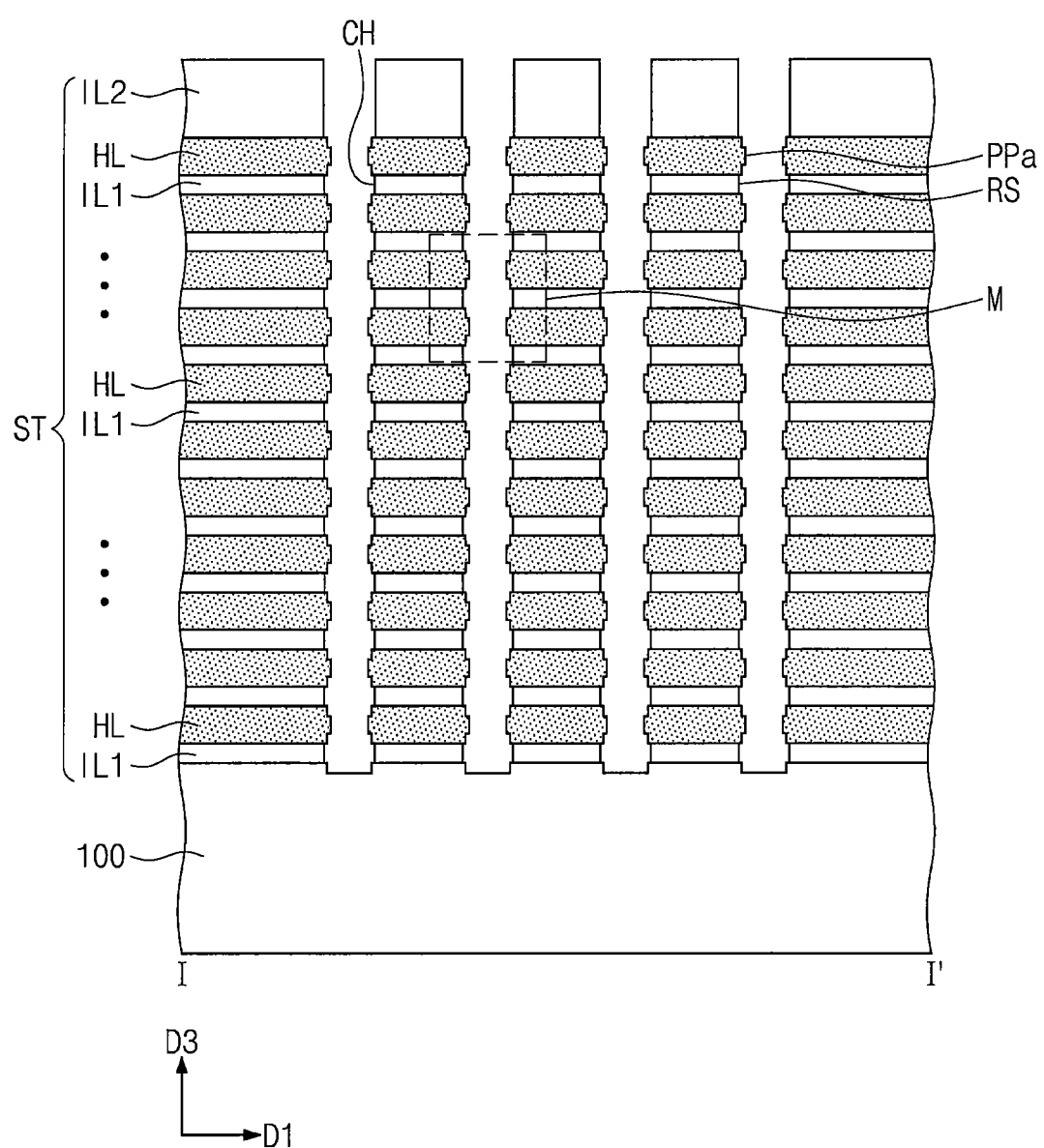

Referring to FIGS. 3 and 8, the first insulating layers IL1 exposed to the channel holes CH may be partially etched to form recess regions RS. The sacrificial layers HL exposed to the channel holes CH may be partially etched to form protrusion sections PPa. The procedure of forming the recess regions RS and the protrusion sections PPa will be described in detail with reference to FIGS. 12A and 12B.

Referring to FIGS. 8 and 12A, an etching process may be performed to selectively etch the first insulating layers IL1 exposed to the channel holes CH. The etching process may include a wet etching process, which uses an etching recipe capable of selectively etching the first insulating layers IL1 (and the second insulating layer IL2). The sacrificial layers HL may not be etched during the etching process.

While the etching process is performed, the first insulating layers IL1 may be recessed to form the recess regions RS. Each of the recess regions RS may be defined by a pair of vertically neighboring sacrificial layers HL and the first insulating layer IL1 therebetween.

Referring to FIGS. 8 and 12B, an etching process may be performed to selectively etch the sacrificial layers HL exposed to the channel holes CH. The etching process may include a wet etching process, which uses an etching recipe capable of selectively etching the sacrificial layers HL. The sacrificial layers HL may be partially etched. An etching depth of the sacrificial layers HL may be less than that of the first insulating layers IL1. Thus, each of the sacrificial layers HL may have the protrusion section PPa that protrudes more toward a center of the channel hole CH than the first insulating layer IL1.

Figure 9:
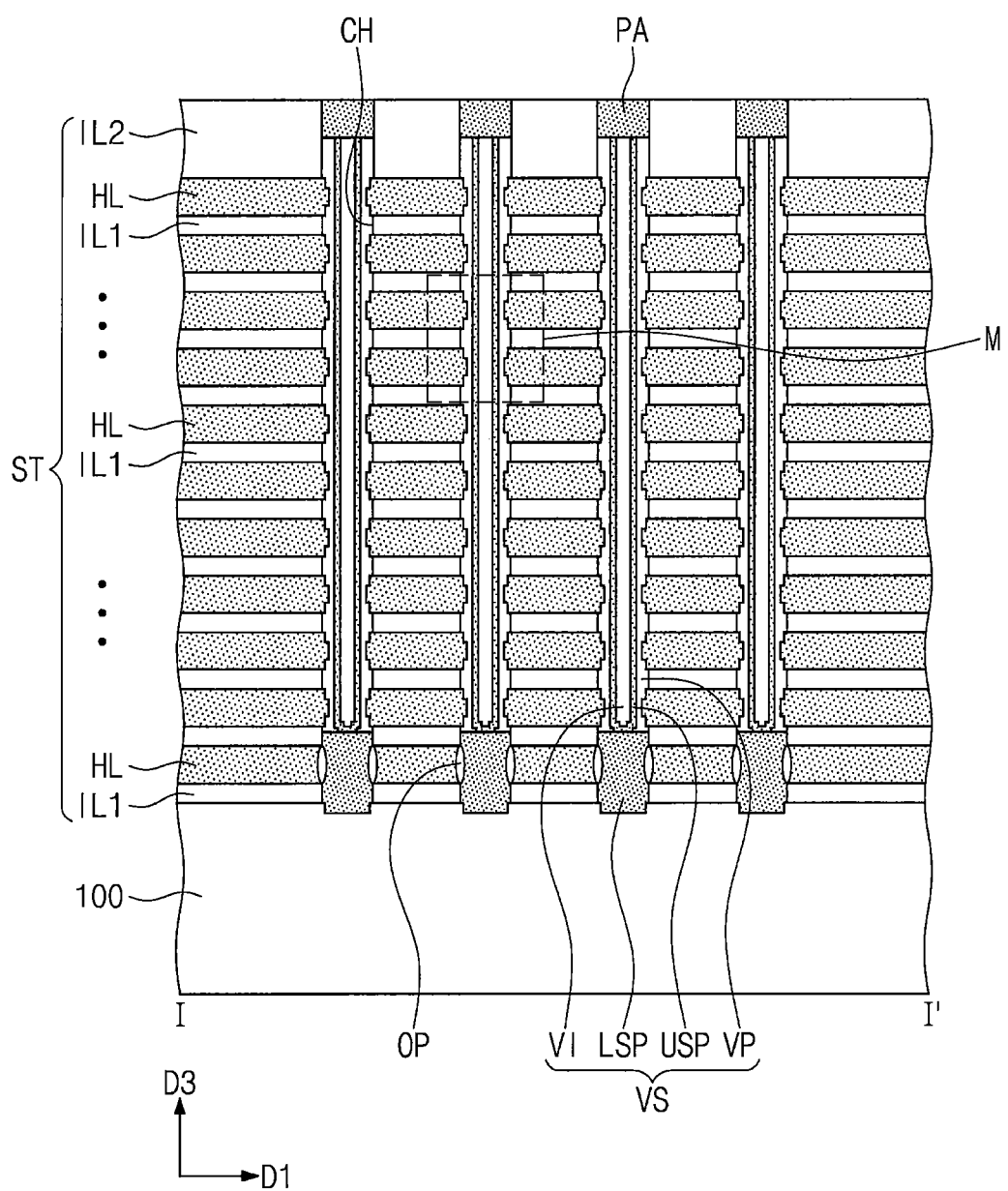

Referring to FIGS. 3 and 9, vertical channel structures VS may be formed in corresponding channel holes CH. For example, lower semiconductor patterns LSP may be formed on the substrate 100 exposed to the channel holes CH. The lower semiconductor patterns LSP may correspondingly fill lower portions of the channel holes CH. The lower semiconductor patterns LSP may be formed by a selective epitaxial growth process in which the substrate 100 exposed to the channel holes CH is used as a seed layer.

A vertical insulating layer VP and an upper semiconductor pattern USP may be formed to sequentially cover an inner sidewall of each of the channel holes CH. Then, a buried insulating pattern VI may be formed to partially or completely fill the channel hole CH. A conductive pad PA may be formed on an upper portion of each of the channel holes CH. The procedure of forming the vertical insulating layer VP, the upper semiconductor pattern USP, and the buried insulating pattern VI will be described in detail with reference to FIGS. 13A, 13B, and 13C.

Referring to FIGS. 9 and 13A, a blocking insulating layer BK may be conformally formed on the first insulating layer IL1 and the sacrificial layer HL that are exposed to the channel hole CH. Thereafter, a charge storage layer TL may be conformally formed on the blocking insulating layer BK. The blocking insulating layer BK and the charge storage layer TL may extend from the protrusion section PPa of the sacrificial layer HL toward the recess region RS. The blocking insulating layer BK and the charge storage layer TL may be crookedly formed or formed to have a nonlinear shape along profiles of the protrusion section PPa and the recess region RS.

For example, the blocking insulating layer BK may include a silicon oxide layer. The charge storage layer TL may include a silicon nitride layer, a silicon oxynitride layer, or a silicon-rich nitride layer. The blocking insulating layer BK and the charge storage layer TL may be formed by using atomic layer deposition (ALD) or chemical vapor deposition (CVD).

Referring to FIGS. 9 and 13B, a filling insulating layer FM may be formed to at least partially fill the recess region RS. The formation of the filling insulating layer FM may include forming an insulating layer on the charge storage layer TL exposed to the channel hole CH and performing an etch-back process on the insulating layer. The etch-back process may be performed until a surface of the charge storage layer TL on the protrusion section PPa is exposed. For example, the filling insulating layer FM may include a silicon oxide layer, a silicon nitride layer, and/or a silicon oxynitride layer.

Referring to FIGS. 9 and 13C, a tunnel insulating layer TN may be conformally formed on the charge storage layer TL and the filling insulating layer FM, which are exposed to the channel hole CH. After that, an upper semiconductor pattern USP may be conformally formed on the tunnel insulating layer TN. A buried insulating pattern VI may be formed on the upper semiconductor pattern USP, partially or completely filling the channel hole CH. A vertical insulating layer VP may comprise the blocking insulating layer BK, the charge storage layer TL, the filling insulating layer FM, and the tunnel insulating layer TN.

The vertical insulating layer VP may include a data storage part DSP on the protrusion section PPa and a connection part CNP at least partially filling the recess region RS. The filling insulating layer FM may be excluded from the data storage part DSP.

The tunnel insulating layer TN and the upper semiconductor pattern USP may be formed generally flat. Differently from the blocking insulating layer BK and the charge storage layer TL, the tunnel insulating layer TN and the upper semiconductor pattern USP may not be crooked or have nonlinear shapes.

The tunnel insulating layer TN may include, for example, either a silicon oxide layer or a high-k insulating layer, such as an aluminum oxide layer and a hafnium oxide layer. The upper semiconductor pattern USP may include silicon (Si), germanium (Ge), or a mixture thereof. The tunnel insulating layer TN and the upper semiconductor pattern USP may be formed by using atomic layer deposition (ALD) or chemical vapor deposition (CVD).

Figure 10:
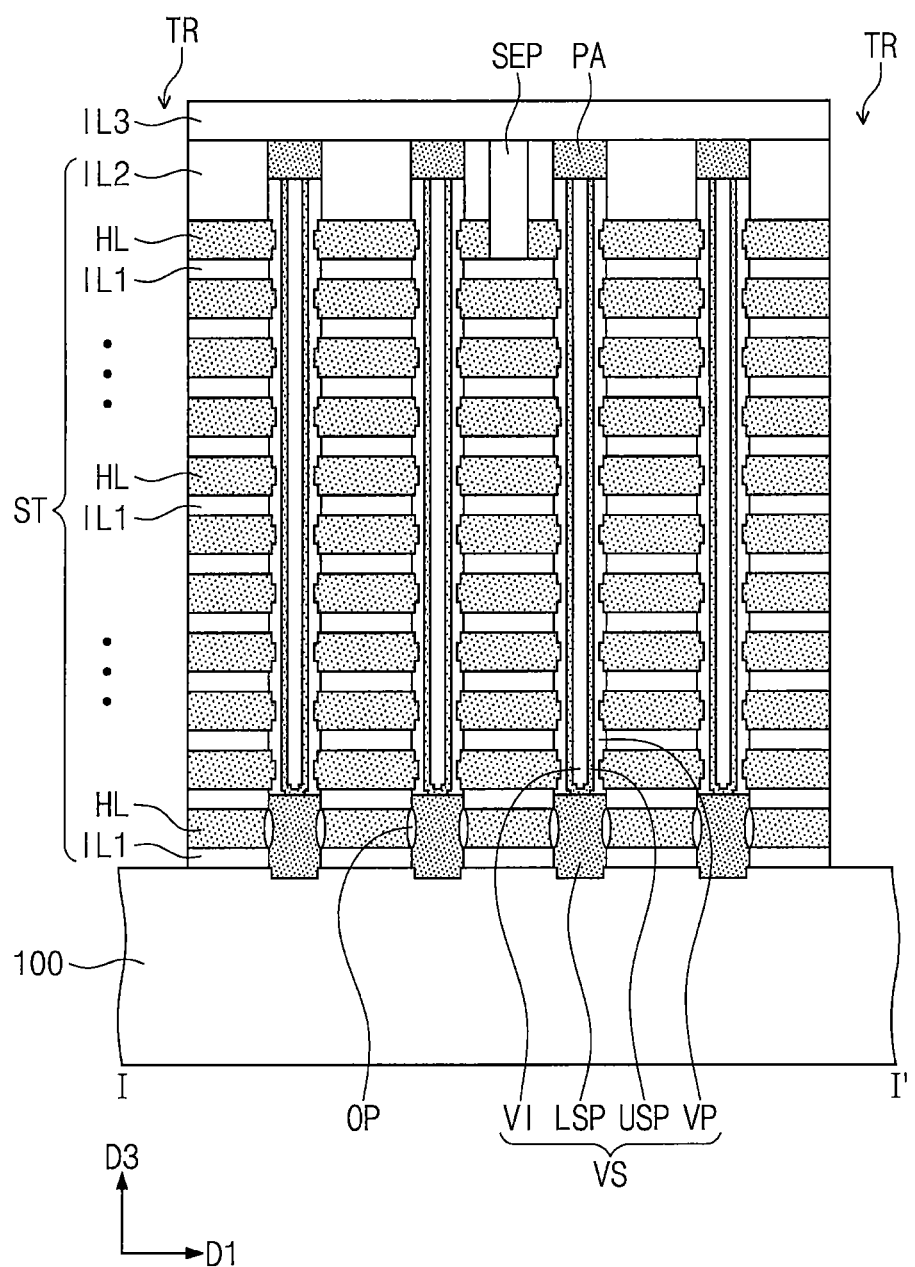

Referring to FIGS. 3 and 10, a separation insulating pattern SEP may be formed in an upper portion of the stack structure ST. The separation insulating pattern SEP may be formed to extend in a second direction D2. For example, the formation of the separation insulating pattern SEP may include etching the second insulating layer IL2 and an uppermost sacrificial layer HL to form a recess and filling the recess with an insulating layer.

A third insulating layer IL3 may be formed on the stack structure ST. The third insulating layer IL3 may at least partially cover the conductive pads PA and the separation insulating pattern SEP. The third insulating layer IL3 and the stack structure ST may be patterned to form trenches TR penetrating the stack structure ST. The trenches TR may partially expose the substrate 100. The trenches TR may extend in the second direction D2 along the stack structure ST.

Figure 11:
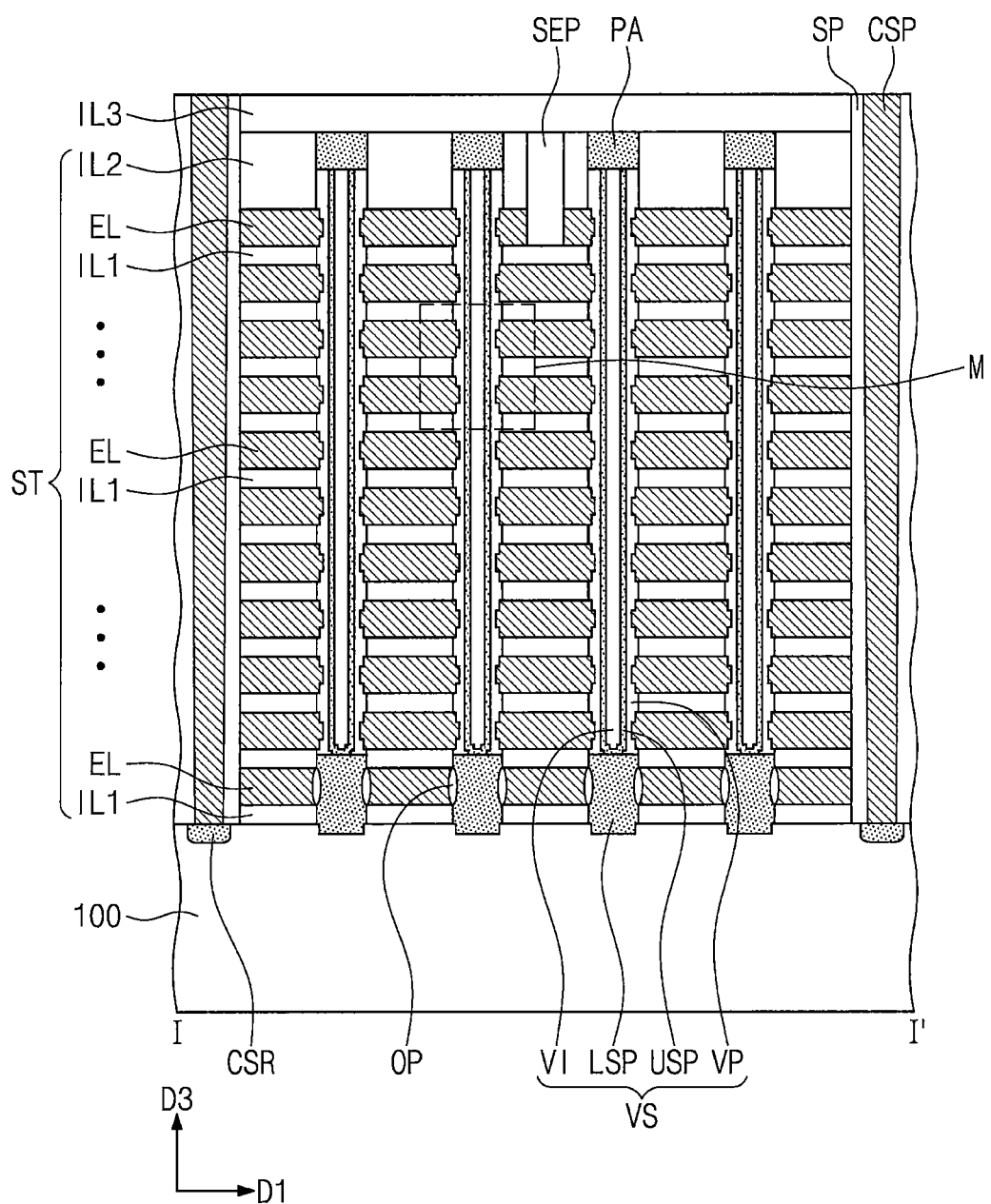

Referring to FIGS. 3 and 11, the sacrificial layers HL may be correspondingly replaced with electrodes EL. The substrate 100 exposed to the trenches TR may be doped with impurities to form common source regions CSR. An insulating spacer SP and a common source plug CSP may be formed to sequentially fill each of the trenches TR. The common source plug CSP may be coupled to the common source region CSR. The procedure of forming the electrodes EL will be described in detail with reference to FIGS. 14 and 5A.

Referring to FIGS. 11 and 14, the sacrificial layers HL exposed to the trenches TR may be selectively removed to form empty spaces ES. The selective removal of the sacrificial layers HL may include performing a wet etching process that uses an etching recipe capable of selectively etching the sacrificial layers HL except for the first insulating layers IL1 and the blocking insulating layer BK.

Referring to FIGS. 11 and 5A, a dielectric pattern GI, a barrier pattern BM, and an electrode pattern GM may be sequentially formed in each of the empty spaces ES. The dielectric pattern GI may be conformally formed to directly cover the first insulating layer IL1 and the blocking insulating layer BK. The barrier pattern BM may be conformally formed to directly cover at least a portion of the dielectric pattern GI. The electrode pattern GM may be formed to partially or completely fill the empty space ES. An electrode EL may comprise the dielectric pattern GI, the barrier pattern BM, and the electrode pattern GM, which are formed in each of the empty spaces ES.

The dielectric pattern GI may include, for example, a silicon oxide layer, a silicon nitride layer, a silicon oxynitride layer, and/or a high-k dielectric material. The barrier pattern BM may include conductive metal nitride. The electrode pattern GM may include a conductive material selected from the group consisting of doped semiconductors, metals, and transition metals.

Referring back to FIGS. 3 and 4, a fourth insulating layer IL4 may be formed on the third insulating layer IL3. Bit line contact plugs BPLG may be formed to penetrate the third and fourth insulating layers IL3 and IL4 and to make connections with corresponding vertical channel structures VS. Bit lines BL may be formed on the fourth insulating layer IL4 and may be coupled to the bit line contact plugs BPLG.

In a fabrication method according to some example embodiments of the inventive concepts, as shown in FIGS. 12A and 12B, the first insulating layer IL1 and the sacrificial layer HL may be partially etched to form the recess region RS before the formation of the charge storage layer TL. The charge storage layer TL may be crookedly formed so as to have a nonlinear shape by the recess region RS. As shown in FIG. 13C, a length L2 of the charge storage layer TL between neighboring data storage parts DSP may be greater than a distance (e.g., L1) between the neighboring data storage parts DSP. The data storage parts DSP may have therebetween a relatively long path through which charges are transferred, and, as a result, the data storage part DSP may be less likely to suffer from loss of data stored therein and devices formed in accordance with some embodiments of the inventive concept may have improved reliability.

The fabrication method according to some example embodiments of the inventive concepts may reduce or prevent loss of data stored in the data storage part DSP without performing a complicated patterning process that removes the charge storage layer TL between the data storage parts DSP. As a result, it may be possible to simplify methods of fabricating semiconductor devices and to reduce costs for fabricating semiconductor devices.

FIGS. 15 to 22 illustrate enlarged cross-sectional views of section M depicted in FIG. 4, showing a three-dimensional semiconductor memory device according to some example embodiments of the inventive concepts. In the description of embodiments that follows, a detailed description of technical features repetitive to those described above with reference to FIGS. 3, 4, 5A, and 5B will be omitted, and differences thereof will be discussed in detail.

Figure 15:
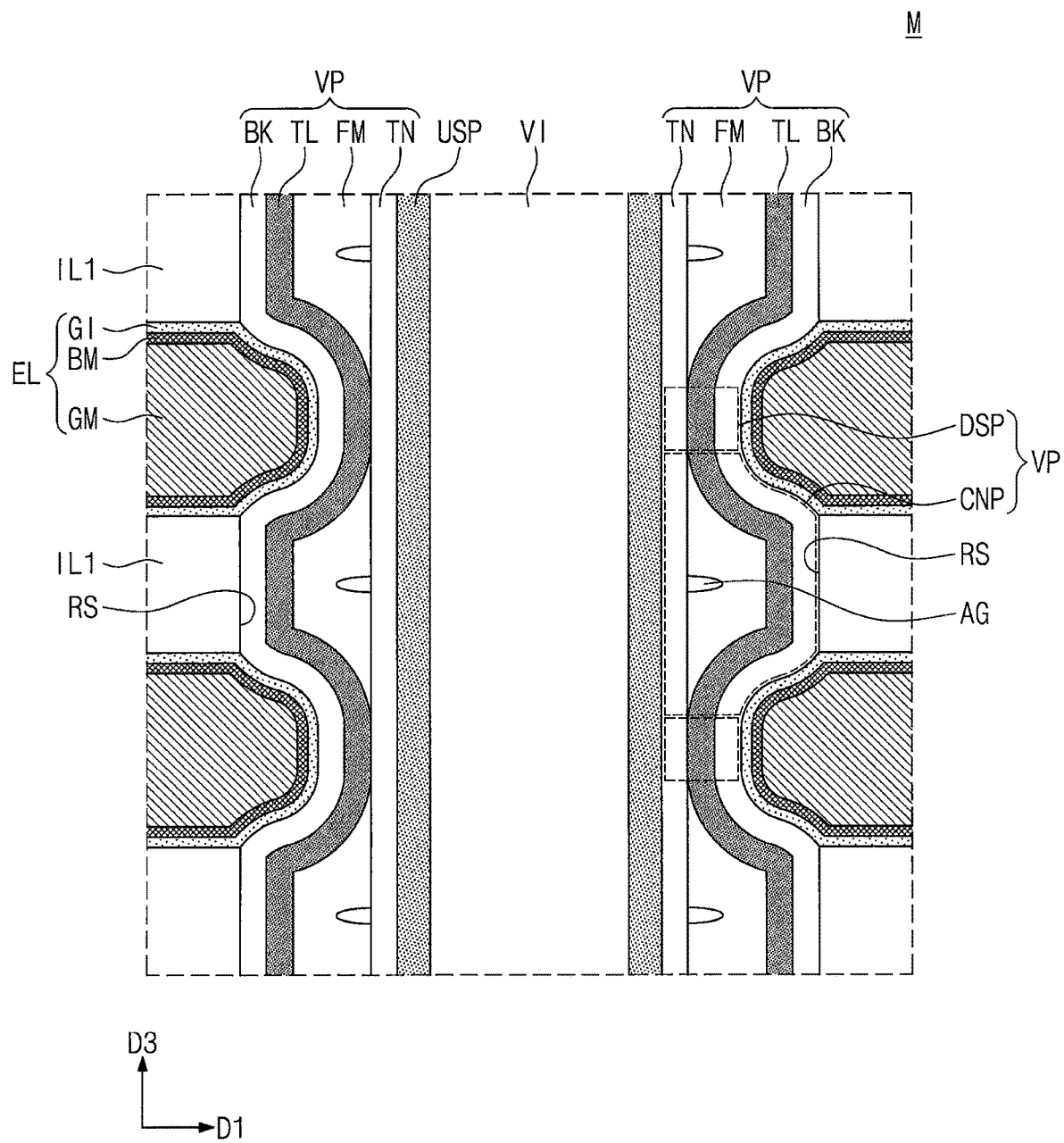
FIGS. 15 to 22 illustrate enlarged cross-sectional views of section M depicted in FIG. 4 showing a three-dimensional semiconductor memory device according to some example embodiments of the inventive concepts.

As one example of the inventive concepts, referring to FIGS. 3, 4, and 15, air gaps AG may be provided in the filling insulating layer FM. For example, the air gap AG may be defined in the filling insulating layer FM of the connection part CNP. The air gap AG may be at least partially surrounded by the filling insulating layer FM and the tunnel insulating layer TN. The filling insulating layer FM may separate the air gap AG from the charge insulating layer TL. The tunnel insulating layer TN may separate the air gap AG from the upper semiconductor pattern USP.

Referring again to FIGS. 9 and 13B described above, the filling insulating layer FM may not completely fill the recess region RS. Subsequently, as shown in FIGS. 9 and 13C, the tunnel insulating layer TN may be formed on the filling insulating layer FM, which may result in the formation of the air gap AG at least partially surrounded by the filling insulating layer FM and the tunnel insulating layer TN.

Figure 16:
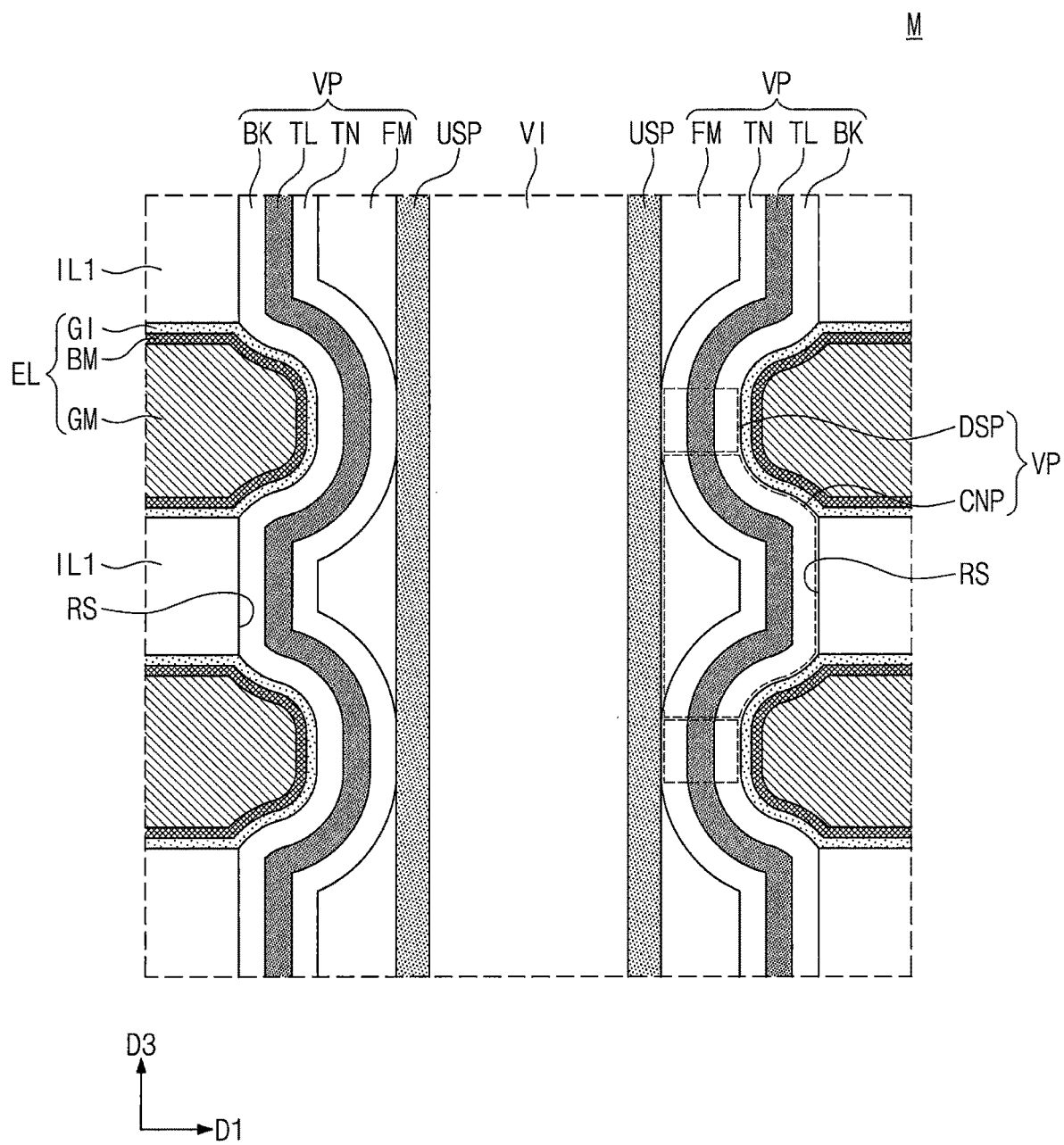

As one example of the inventive concepts, referring to FIGS. 3, 4, and 16, the blocking insulating layer BK, the charge storage layer TL, and the tunnel insulating layer TN of the vertical insulating layer VP may be sequentially stacked on the electrode EL. The tunnel insulating layer TN may be crooked or have a nonlinear shape like the charge storage layer TL. The filling insulating layer FM may be interposed between the tunnel insulating layer TN and the upper semiconductor pattern USP. The tunnel insulating layer TN of the connection part CNP may be spaced apart from the upper semiconductor pattern USP across from the filling insulating layer FM.

Figure 17:
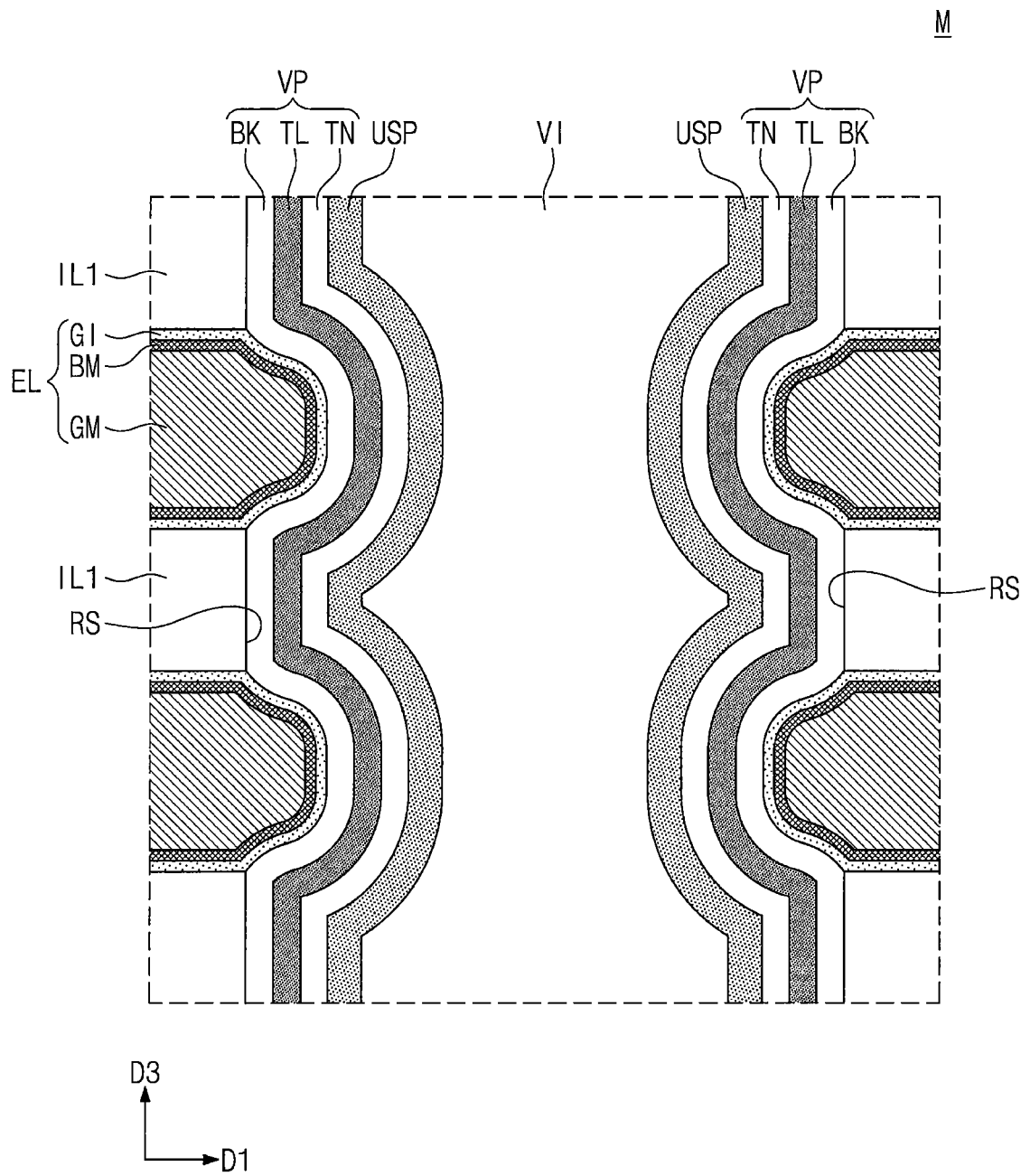

As one example of the inventive concepts, referring to FIGS. 3, 4, and 17, the vertical insulating layer VP may include the blocking insulating layer BK, the charge storage layer TL, and the tunnel insulating layer TN. Differently from the vertical insulating layer VP shown in FIGS. 5A and 5B, the vertical insulating layer VP may not include the filling insulating layer FM. The blocking insulating layer BK, the charge storage layer TL, the tunnel insulating layer TN, and the upper semiconductor pattern USP may be sequentially stacked on the electrode EL. The tunnel insulating layer TN may be crooked or have a nonlinear shape like the charge storage layer TL. The upper semiconductor pattern USP may be crooked or have a nonlinear shape like the charge storage layer TL.

Figure 18:
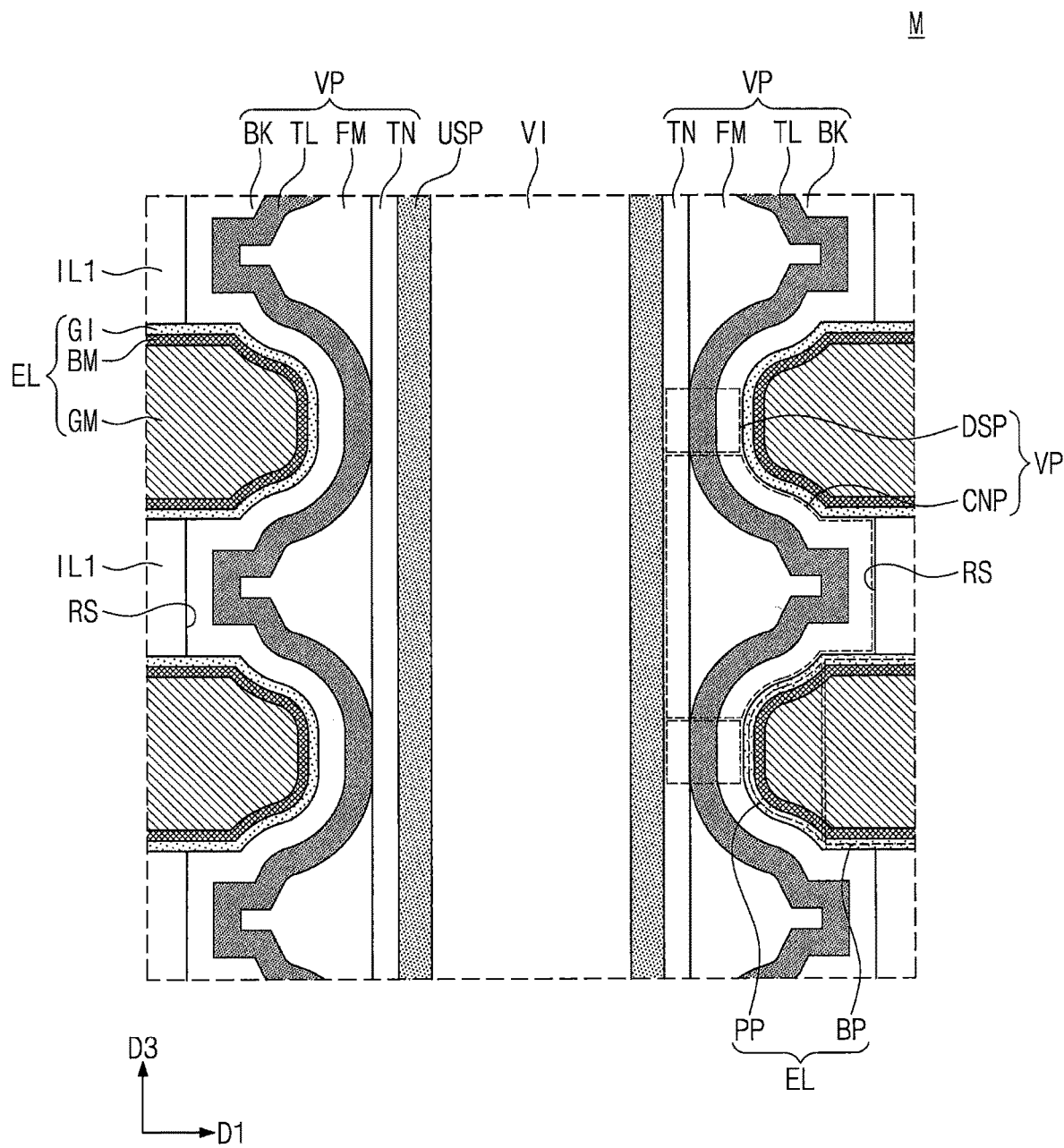

As one example of the inventive concepts, referring to FIGS. 3, 4, and 18, the recess region RS may be recessed deeper than the recess region RS shown in FIGS. 5A and 5B. For example, compared to a boundary between the body and protrusion parts BP and PP of the electrode EL, the first insulating layer IL1 may be recessed in a direction away from the upper semiconductor pattern USP. The first insulating layer IL1 may have a sidewall at least partially covered with the blocking insulating layer BK, and the sidewall may be offset from the boundary between the body part BP and the protrusion part PP toward a direction away from the upper semiconductor pattern USP.

Because the recess region RS is more deeply recessed, the charge storage layer TL may be more sharply crooked or may have deeper irregularities. The charge storage layer TL of the connection part CNP may have a length greater than the length L2 of the charge storage layer TL of the connection part CNP shown in FIGS. 5A and 5B. Therefore, the data storage part DSP may be less likely to suffer from loss of data stored therein.

Referring back to FIGS. 8 and 12B described above, after the sacrificial layer HL is partially etched to form the protrusion section PPa, the first insulating layer IL1 may be selectively etched once more. Because the first insulating layer IL1 is etched once more, the recess region RS may become even deeper. The re-etching of the first insulating layers IL1 may be the same as the etching process performed on the first insulating layers IL1 described with reference to FIGS. 8 and 12A.

Figure 19:
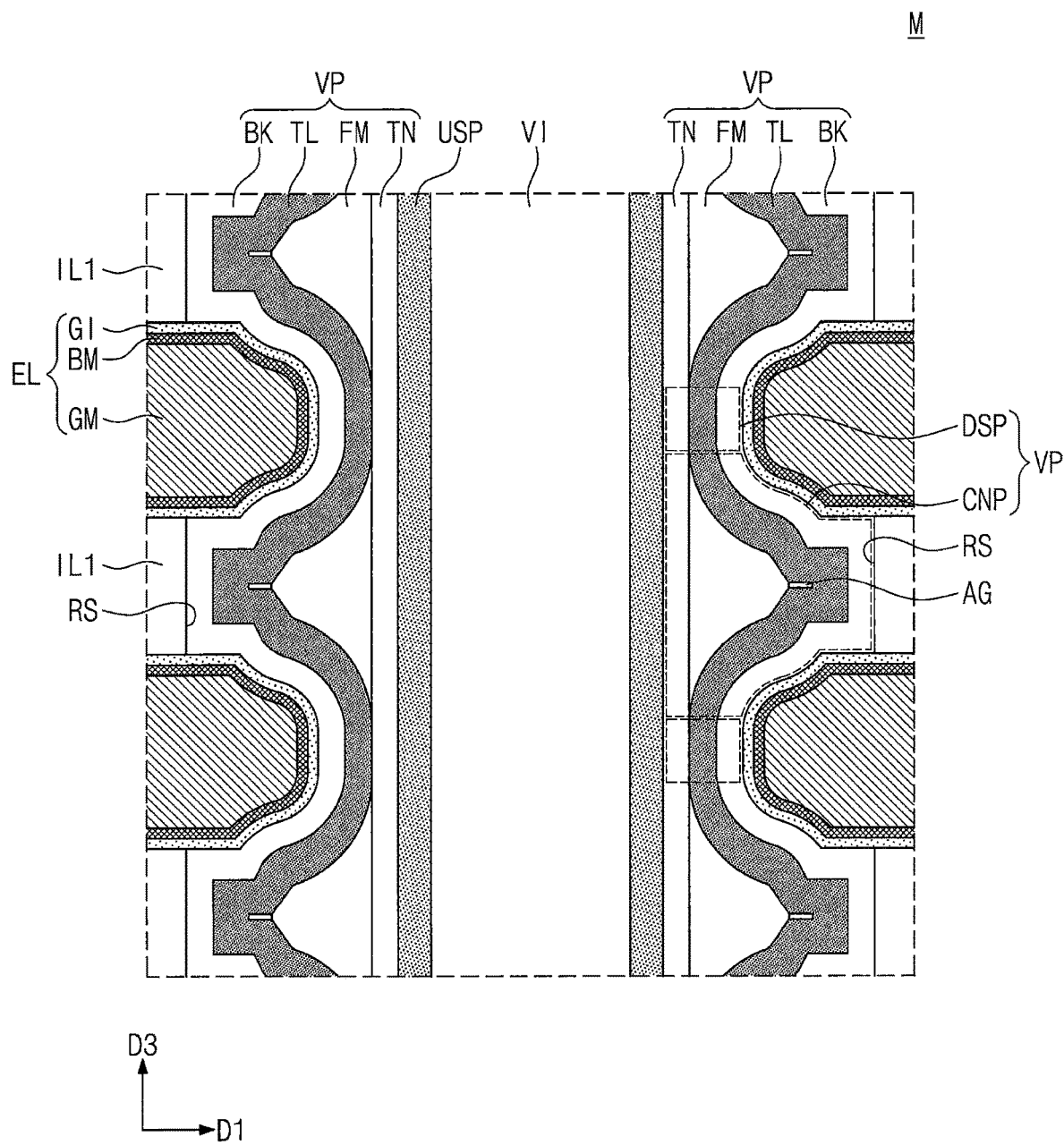

As one example of the inventive concepts, referring to FIGS. 3, 4, and 19, the air gap AG may be defined between the filling insulating layer FM and the charge storage layer TL of the connection part CNP. The air gap AG may be at least partially surrounded by the charge storage layer TL and the filling insulating layer FM. The air gap AG may be formed when the charge storage layer TL does not completely fill the recess region RS.

Figure 20:
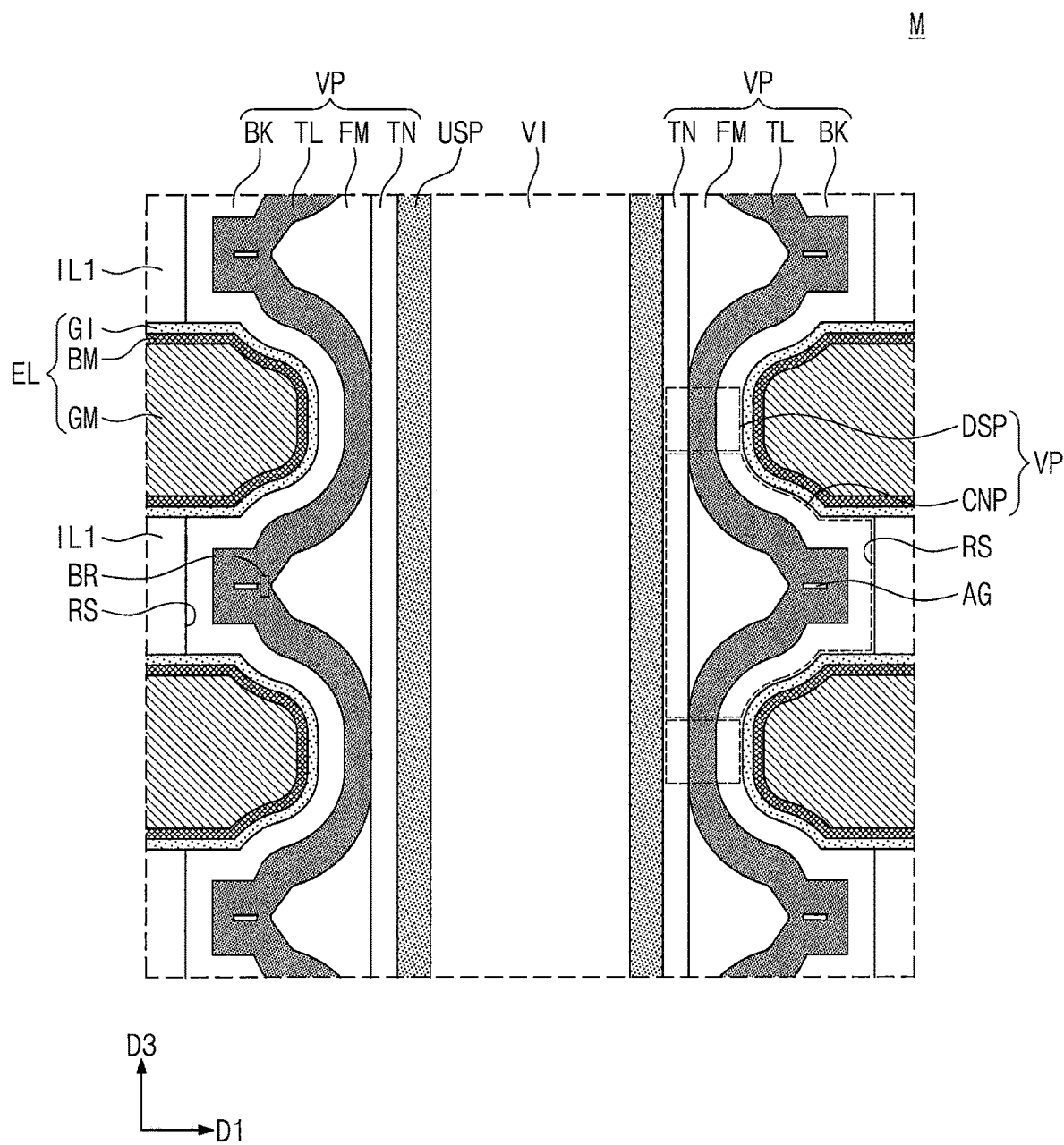

As one example of the inventive concepts, referring to FIGS. 3, 4, and 20, the air gap AG may be defined in the charge storage layer TL of the connection part CNP. The air gap AG may be at least partially surrounded by the charge storage layer TL. The charge storage layer TL may include a bridge region BR interposed between the air gap AG and the filling insulating layer FM. The bridge region BR may separate the air gap AG from the filling insulating layer FM. The bridge region BR may be formed due to overhang, which may occur when the charge storage layer TL is deposited, and, accordingly, the air gap AG may be defined in the charge storage layer TL.

Figure 21:
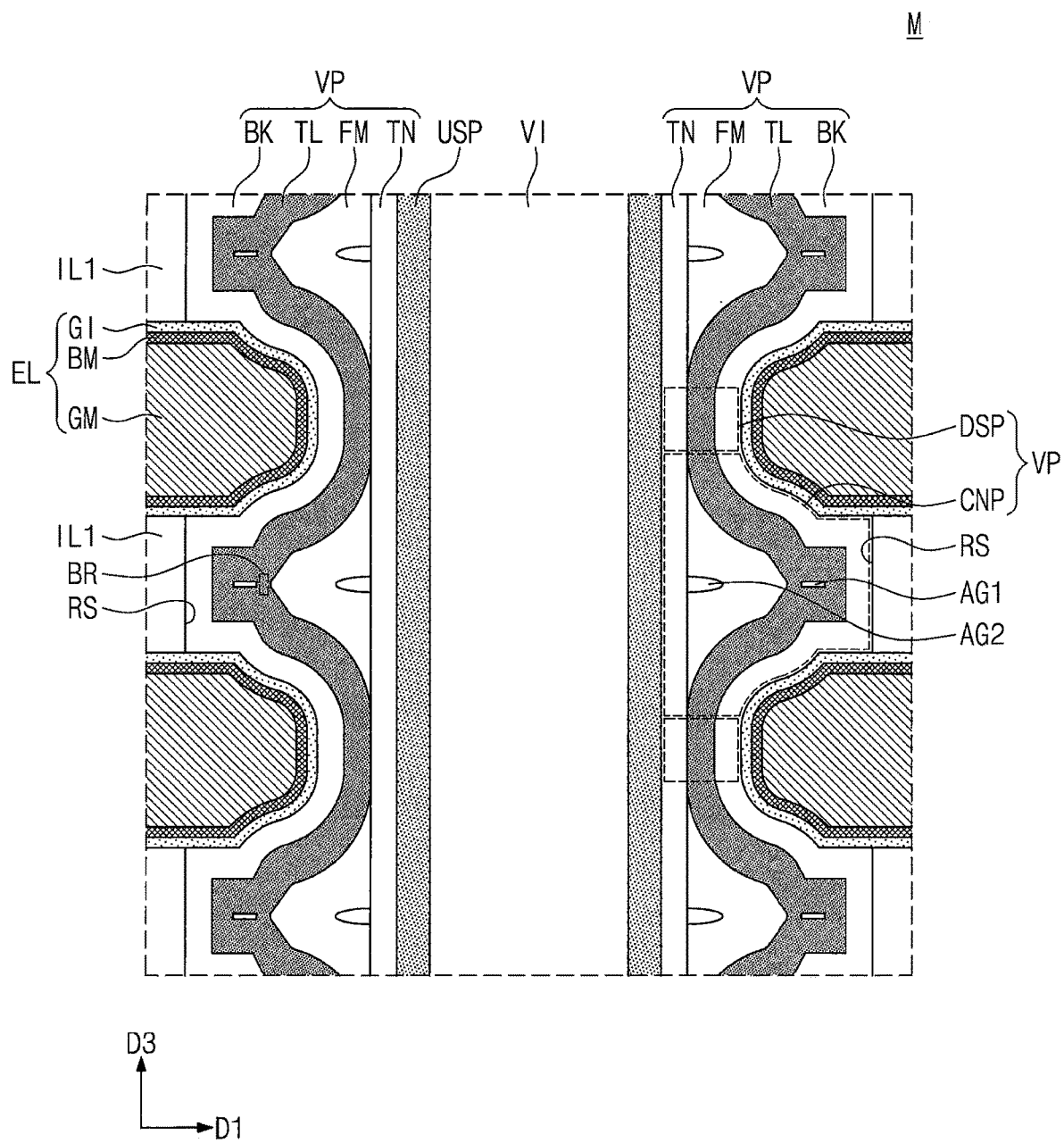

As one example of the inventive concepts, referring to FIGS. 3, 4, and 21, a first air gap AG1 may be defined in the charge storage layer TL of the connection part CNP. A second air gap AG2 may be defined in the filling insulating layer FM of the connection part CNP. The first air gap AG1 may be substantially the same as the air gap AG described above with reference to FIG. 20, and the second air gap AG2 may be substantially the same as the air gap AG described above with reference to FIG. 15.

The first air gap AG1 and the second air gap AG2 may be defined in a single connection part CNP. The first air gap AG1 and the second air gap AG2 may be located at substantially the same level relative to the substrate 100. The first air gap AG1 and the second air gap AG2 may be horizontally spaced apart from each other as shown in FIG. 21. In FIG. 21, the second air gap AG2 is illustrated to have a size greater than that of the first air gap AG1, but embodiments of the inventive concepts are not limited thereto. The size of the second air gap AG2 may be the same as or less than that of the first air gap AG1.

Figure 22:
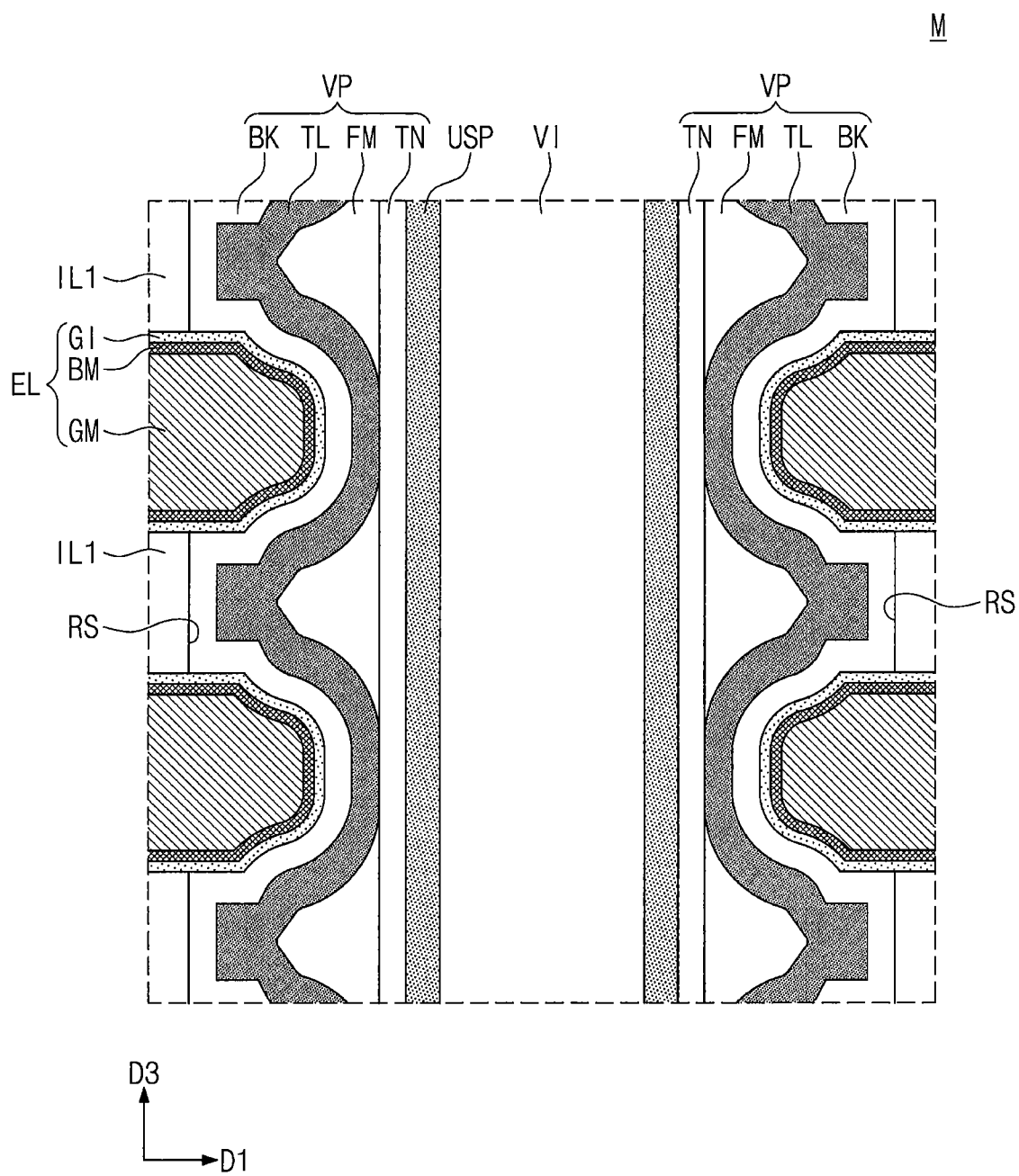

As one example of embodiments of the inventive concepts, referring to FIGS. 3, 4, and 22, the charge storage layer TL may have the same shape as that of the charge storage layer TL of FIG. 20, but may not include the air gap AG therein. For example, the charge storage layer TL may completely fill the recess region RS.

Figure 23:
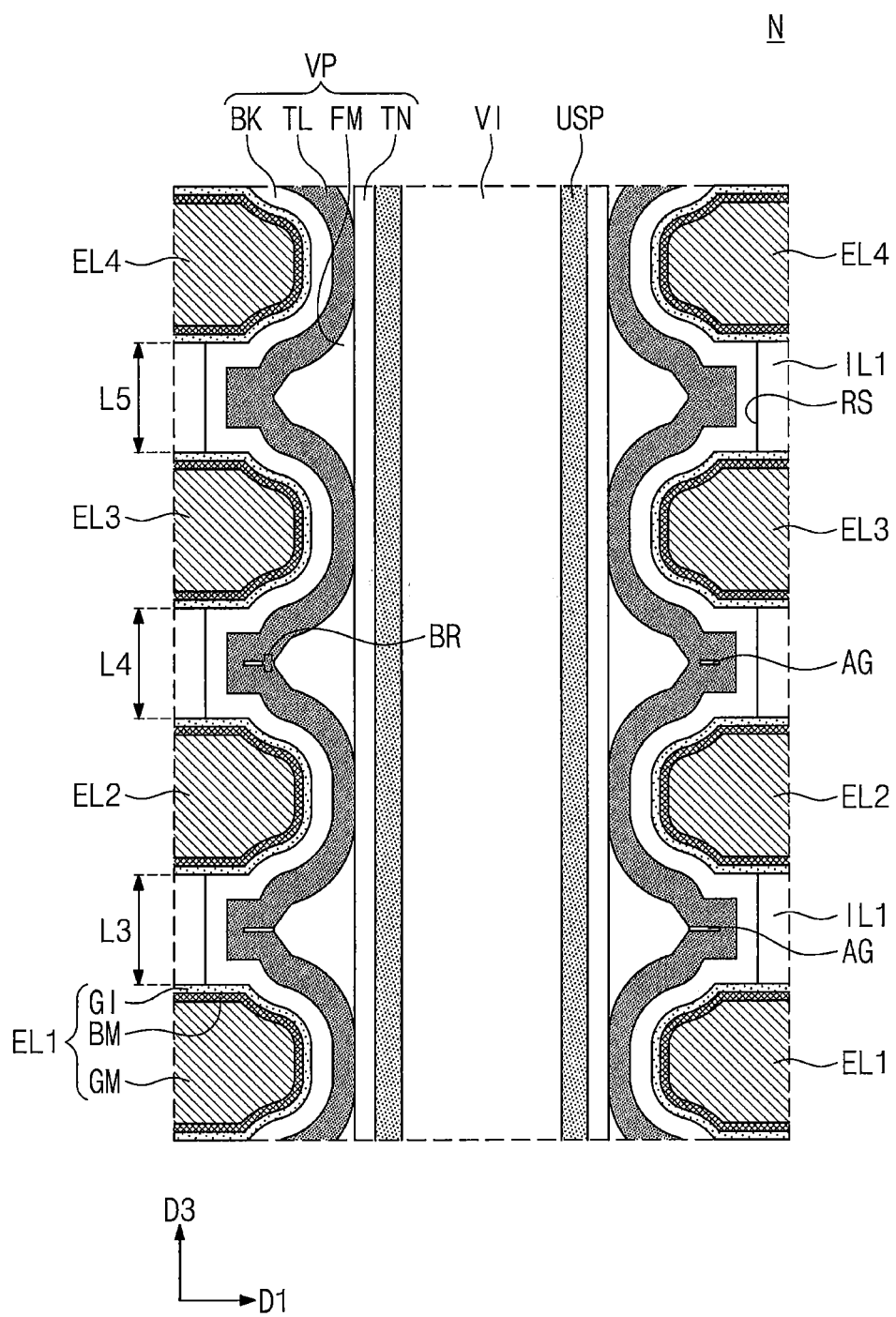
FIG. 23 illustrates an enlarged cross-sectional view of section N depicted in FIG. 4, showing a three-dimensional semiconductor memory device according to some example embodiments of the inventive concepts.

FIG. 23 illustrates an enlarged cross-sectional view of section N depicted in FIG. 4, showing a three-dimensional semiconductor memory device according to some example embodiments of the inventive concepts. In the embodiment that follows, a detailed description of technical features repetitive to those discussed with reference to FIGS. 3 to 5B and 15 to 22 will be omitted, and differences thereof will be discussed in detail.

Referring to FIGS. 3, 4, and 23, the electrodes EL of the stack structure ST may include a first electrode EL1, a second electrode EL2, a third electrode EL3, and a fourth electrode EL4 that are sequentially stacked.

The first insulating layers IL1 may have different thicknesses from each other. The first insulating layer IL1 between the first and second electrodes EL1 and EL2 may have a thickness greater than that of the first insulating layer IL1 between the second and third electrodes EL2 and EL3. For example, a third distance L3 between the first and second electrodes EL1 and EL2 may be greater than a fourth distance L4 between the second and third electrodes EL2 and EL3. The thickness of the first insulating layer IL1 between the second and third electrodes EL2 and EL3 may be greater than that of the first insulating layer IL1 between the third and fourth electrodes EL3 and EL4. For example, the fourth distance L4 between the second and third electrodes EL2 and EL3 may be greater than a fifth distance L5 between the third and fourth electrodes EL3 and EL4.

Because the first and second electrodes EL1 and EL2 are spaced apart at the third distance L3, which is relatively large, the charge storage layer TL may not completely fill the recess region RS between the first and second electrodes EL1 and EL2. Therefore, similar to the embodiment shown in FIG. 19, the air gap AG may be included in the vertical insulating layer VP between the first and second electrodes EL1 and EL2. The air gap AG may be defined between the charge storage layer TL and the filling insulating layer FM.

Similar to the embodiment shown in FIG. 20, the air gap AG may be defined in the charge storage layer TL between the second and third electrodes EL2 and EL3. Because the fourth distance L4 between the second and third electrodes EL2 and EL3 is less than the third distance L3, the bridge region BR may be formed, which defines the air gap AG in the charge storage layer TL between the second and third electrodes EL2 and EL3. In this case, the charge storage layer TL between the second and third electrodes EL2 and EL3 may include the bridge region BR interposed between the air gap AG and the filling insulating layer FM. For example, the air gap AG between the first and second electrodes EL1 and EL2 may have a size greater than that of the air gap AG between the second and third electrodes EL2 and EL3.

Because the fifth distance L5 between the third and fourth electrodes EL3 and EL4 is less than the fourth distance L4, the charge storage layer TL may completely fill the recess region RS between the third and fourth electrodes EL3 and EL4. Therefore, similar to the embodiment shown in FIG. 22, the air gap AG may not be included in the charge storage layer TL between the third and fourth electrodes EL3 and EL4.

In a semiconductor memory device according to some example embodiments of the inventive concepts, a single cell array may include at least one of a plurality of embodiments discussed above with reference to FIGS. 18 to 22. For example, the charge storage layer TL according to the embodiment shown in FIG. 19 may be disposed between the first and second electrodes EL1 and EL2 of a cell array, the charge storage layer TL according to the embodiment shown in FIG. 20 may be placed between the second and third electrodes EL2 and EL3 of the cell array, and the charge storage layer TL according to the embodiment shown in FIG. 22 may be positioned between the third and fourth electrodes EL3 and EL4 of the cell array.

According to some example embodiments of the inventive concepts, a semiconductor memory device may reduce or prevent data (charges) stored in a certain data storage part from moving toward a different data storage part adjacent to the certain data storage part. As a result, the semiconductor memory device may reduce or prevent loss of data stored in the data storage part and also provide improved reliability.

Although the present invention has been described in connection with some example embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of inventive concepts.

What is claimed is:

1. A semiconductor memory device, comprising:
a stack structure comprising a plurality of electrodes and a plurality of insulating layers that are alternately stacked on a substrate; and
a vertical channel structure penetrating the stack structure,
wherein the vertical channel structure comprises a semiconductor pattern and a vertical insulating layer between the semiconductor pattern and the plurality of electrodes, and
wherein the vertical insulating layer comprises a charge storage layer, a filling insulating layer, and a tunnel insulating layer,
wherein the vertical insulating layer has a cell region between the semiconductor pattern and each of the plurality of electrodes, and a cell separation region between the semiconductor pattern and each of the plurality of insulating layers,
wherein the charge storage layer comprises a first portion and a remaining portion in the cell region, the first portion of the charge storage layer of the cell region is in physical contact with the tunnel insulating layer,
wherein the filling insulating layer is between the semiconductor pattern and the remaining portion of the charge storage layer of the cell region, and
wherein the filling insulating layer of the cell region overlaps a corresponding one of the plurality of electrodes in a first direction parallel to the substrate.

2. The semiconductor memory device of claim 1, wherein a bottom surface of the cell region and a bottom surface of the electrode adjacent to the cell region are at substantially same levels, respectively, and
a top surface of the cell region and a top surface of the electrode adjacent to the cell region are at substantially same levels, respectively.

3. The semiconductor memory device of claim 1, wherein the remaining portion of the charge storage layer of the cell region is spaced apart from the tunnel insulating layer across the filling insulating layer.

4. The semiconductor memory device of claim 1, wherein the tunnel insulating layer is between the charge storage layer and the semiconductor pattern.

5. The semiconductor memory device of claim 1, wherein the filling insulating layer of the cell separation region is between the charge storage layer and the tunnel insulating layer.

6. The semiconductor memory device of claim 1, wherein each of the plurality of electrodes includes a protrusion part, which protrudes closer to the semiconductor pattern than an outer sidewall of the charge storage layer of the cell separation region.

7. The semiconductor memory device of claim 6, wherein the protrusion part has a curved surface.

8. The semiconductor memory device of claim 6, wherein a maximum thickness of each of the plurality of protrusion parts is less than a maximum thickness of each of the plurality of electrodes, respectively.

9. The semiconductor memory device of claim 1, wherein
the filling insulating layer of the cell region has a first thickness in a first direction, and
the filling insulating layer of the cell separation region has the second thickness in the first direction, the second thickness being greater than the first thickness.

10. The semiconductor memory device of claim 1, wherein the charge storage layer has a nonlinear shape between a pair of the plurality of electrodes adjacent to each other in a direction normal to the substrate.

11. A semiconductor memory device, comprising:
a stack structure comprising a plurality of electrodes and a plurality of insulating layers that are alternately stacked on a substrate; and
a vertical channel structure penetrating the stack structure,
wherein the vertical channel structure comprises a semiconductor pattern and a vertical insulating layer between the semiconductor pattern and the plurality of electrodes, and
wherein the vertical insulating layer comprises a charge storage layer, a filling insulating layer, and a tunnel insulating layer,
wherein the filling insulating layer and the tunnel insulating layer are between the charge storage layer and the semiconductor pattern,
wherein the vertical insulating layer has a cell region between the semiconductor pattern and each of the plurality of electrodes and a cell separation region between the semiconductor pattern and each of the plurality of insulating layers,
wherein the filling insulating layer of the cell region has a first thickness in a first direction parallel to the substrate,
wherein the filling insulating layer of the cell separation region has a second thickness in the first direction, the second thickness being greater than the first thickness, and
wherein the filling insulating layer of the cell region overlaps a corresponding one of the plurality of electrodes in the first direction.

12. The semiconductor memory device of claim 11, wherein
a bottom surface of the cell region and a bottom surface of the electrode adjacent to the cell region are at substantially same levels, respectively, and
a top surface of the cell region and a top surface of the electrode adjacent to the cell region are at substantially same levels, respectively.

13. The semiconductor memory device of claim 11, wherein the charge storage layer comprises a first portion and a remaining portion in the cell region;
wherein the first portion of the charge storage layer of the cell region is in physical contact with the tunnel insulating layer, and
wherein the remaining portion of the charge storage layer of the cell region is spaced apart from the tunnel insulating layer across the filling insulating layer.

14. The semiconductor memory device of claim 11, wherein the filling insulating layer of the cell separation region is between the charge storage layer and the tunnel insulating layer.

15. The semiconductor memory device of claim 11, wherein the charge storage layer has a nonlinear shape between a pair of the plurality of electrodes adjacent to each other in a direction normal to the substrate.

16. A semiconductor memory device, comprising:
a stack structure comprising a plurality of electrodes and a plurality of insulating layers that are alternately stacked on a substrate; and
a vertical channel structure penetrating the stack structure,
wherein the vertical channel structure comprises a semiconductor pattern and a vertical insulating layer between the semiconductor pattern and the plurality of electrodes, and
wherein the vertical insulating layer comprises a charge storage layer, a filling insulating layer, and a tunnel insulating layer,
wherein the vertical insulating layer has a cell region between the semiconductor pattern and each of the plurality of electrodes and a cell separation region between the semiconductor pattern and each of the plurality of insulating layers,
wherein a bottom surface of the cell separation region and a bottom surface of the insulating layer adjacent to the cell separation region are at substantially same levels, respectively,
wherein a top surface of the cell separation region and a top surface of the insulating layer adjacent to the cell separation region are at substantially same levels, respectively,
wherein the filling insulating layer of the cell separation region extends from the bottom surface of the cell separation region to the top surface of the cell separation region, and
wherein the filling insulating layer of the cell region overlaps a corresponding one of the plurality of electrodes in a first direction parallel to the substrate.

17. The semiconductor memory device of claim 16, wherein
the cell region comprises a first cell region and a second cell region adjacent to the first cell region in a direction normal to the substrate,
the cell separation region is between the first and second cell regions, and
the filling insulating layer extends from the first cell region toward the second cell region.

18. The semiconductor memory device of claim 17, wherein the charge storage layer comprises a first portion and a remaining portion in the first cell region;
wherein the first portion of the charge storage layer of the first cell region is in physical contact with the tunnel insulating layer, and
wherein the filling insulating layer is between the semiconductor pattern and the remaining portion of the charge storage layer of the first cell region.

19. The semiconductor memory device of claim 16, wherein the filling insulating layer of the cell separation region is between the charge storage layer and the tunnel insulating layer.

20. The semiconductor memory device of claim 16, wherein the charge storage layer has a nonlinear shape between a pair of the plurality of electrodes adjacent to each other in a direction normal to the substrate.

* * * * *